US011479670B2

(12) United States Patent
Fukui et al.

(10) Patent No.: US 11,479,670 B2
(45) Date of Patent: Oct. 25, 2022

(54) FLUOROALKYL GROUP-CONTAINING CURABLE ORGANOPOLYSILOXANE COMPOSITION, CURED PRODUCT THEREOF, AND TRANSDUCER OR THE LIKE PROVIDED WITH CURED PRODUCT

(71) Applicant: DOW TORAY CO., LTD., Tokyo (JP)

(72) Inventors: Hiroshi Fukui, Ichihara (JP); Kyoko Toyama, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 78 days.

(21) Appl. No.: 16/613,781

(22) PCT Filed: May 2, 2018

(86) PCT No.: PCT/JP2018/017480
§ 371 (c)(1),
(2) Date: Nov. 14, 2019

(87) PCT Pub. No.: WO2018/211981
PCT Pub. Date: Nov. 22, 2018

(65) Prior Publication Data
US 2020/0071527 A1 Mar. 5, 2020

(30) Foreign Application Priority Data
May 18, 2017 (JP) .............................. JP2017-099138

(51) Int. Cl.
| C08L 83/08 | (2006.01) |
| C08G 77/12 | (2006.01) |
| C08G 77/20 | (2006.01) |
| C08G 77/24 | (2006.01) |
| C08G 77/00 | (2006.01) |
| H01L 41/083 | (2006.01) |
| H01L 41/193 | (2006.01) |

(52) U.S. Cl.
CPC .............. *C08L 83/08* (2013.01); *C08G 77/12* (2013.01); *C08G 77/20* (2013.01); *C08G 77/24* (2013.01); *C08G 77/80* (2013.01); *H01L 41/083* (2013.01); *H01L 41/193* (2013.01); *C08L 2203/20* (2013.01); *C08L 2205/02* (2013.01); *C08L 2312/00* (2013.01)

(58) Field of Classification Search
CPC ................................ C08L 83/08; C08G 77/24
USPC .......................................................... 528/42
See application file for complete search history.

(56) References Cited

U.S. PATENT DOCUMENTS

| 4,818,805 A | 4/1989 | Ikeno et al. |
| 5,082,706 A * | 1/1992 | Tangney ............... C09D 183/08 428/40.7 |
| 5,405,929 A | 4/1995 | Kobayashi |
| 5,665,794 A * | 9/1997 | Maxson ................... C08L 83/08 523/209 |
| 2005/0038183 A1 | 2/2005 | Ahn et al. |
| 2005/0282959 A1 | 12/2005 | Ahn et al. |
| 2011/0244226 A1* | 10/2011 | Seth ......................... C08L 27/16 524/506 |
| 2012/0219794 A1* | 8/2012 | Seth ....................... C09D 183/08 428/352 |
| 2014/0175504 A1 | 6/2014 | Kobayashi et al. |
| 2015/0344671 A1 | 12/2015 | Furukawa et al. |
| 2016/0215099 A1 | 7/2016 | Enami |
| 2016/0297999 A1* | 10/2016 | Carvajal ................. C08L 83/08 |
| 2016/0329562 A1 | 11/2016 | Akira et al. |
| 2017/0260383 A1 | 9/2017 | Fukui et al. |
| 2018/0065347 A1 | 3/2018 | Fukui et al. |
| 2019/0127531 A1 | 5/2019 | Fukui et al. |

FOREIGN PATENT DOCUMENTS

| JP | 63205359 A | 8/1988 |
| JP | H0718183 A | 1/1995 |
| JP | H1081825 A | 3/1998 |
| JP | 2007502345 A | 2/2007 |
| JP | 2007502346 A | 2/2007 |
| JP | 2014139292 A | 7/2014 |
| JP | 2016503108 A | 2/2016 |
| JP | 2017114983 A | 6/2017 |
| WO | 2014105959 A1 | 7/2014 |
| WO | 2015098072 A1 | 7/2015 |
| WO | 2016031242 A1 | 3/2016 |
| WO | 2016098334 A1 | 6/2016 |

(Continued)

OTHER PUBLICATIONS

English translation of International Search Report for PCT/JP2018/017480 dated Aug. 7, 2018, 3 pages.

(Continued)

*Primary Examiner* — Margaret G Moore
(74) *Attorney, Agent, or Firm* — Warner Norcross + Judd LLP

(57) ABSTRACT

A curable organopolysiloxane composition is provided. The composition can be easily processed into a film shape and has a high specific dielectric constant, high dielectric breakdown strength, and a low Young's modulus, allowing for a high energy density to be achieved, in addition to having excellent mechanical strength when used as a dielectric layer in a transducer. A fluoroalkyl group-containing curable organopolysiloxane composition, which can be cured by an addition reaction, comprises: an organopolysiloxane containing an alkenyl group and a fluoroalkyl group; an organohydrogen polysiloxane having SiH at both terminals of a molecular chain but not having a fluoroalkyl group; and a linear fluoroalkyl group-containing organohydrogen polysiloxane or a branched fluoroalkyl group-containing organohydrogen polysiloxane having T units.

17 Claims, 4 Drawing Sheets

(56) References Cited

FOREIGN PATENT DOCUMENTS

WO      2016163069 A1    10/2016
WO      2017183541 A1    10/2017

OTHER PUBLICATIONS

Machine assisted English translation of JP2017114983A obtained from https://patents.google.com on Feb. 17, 2020, 12 pages.

* cited by examiner

[FIG. 1]
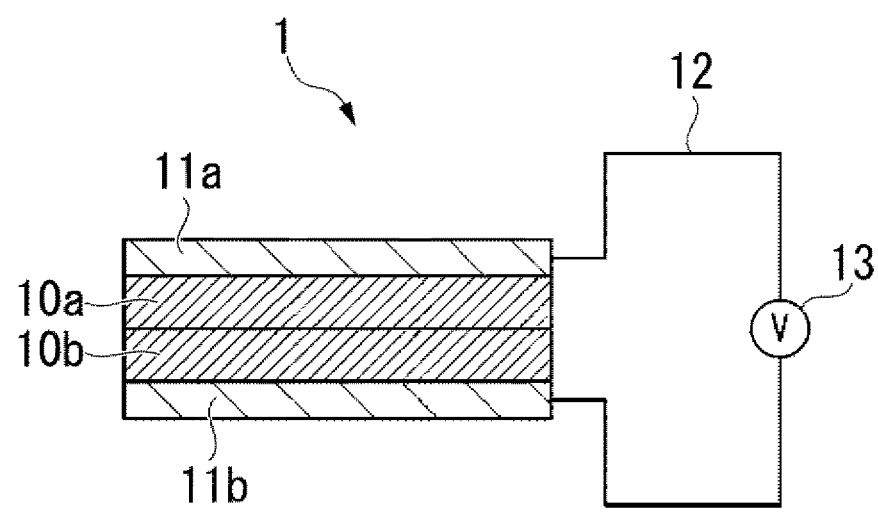

[FIG. 2]
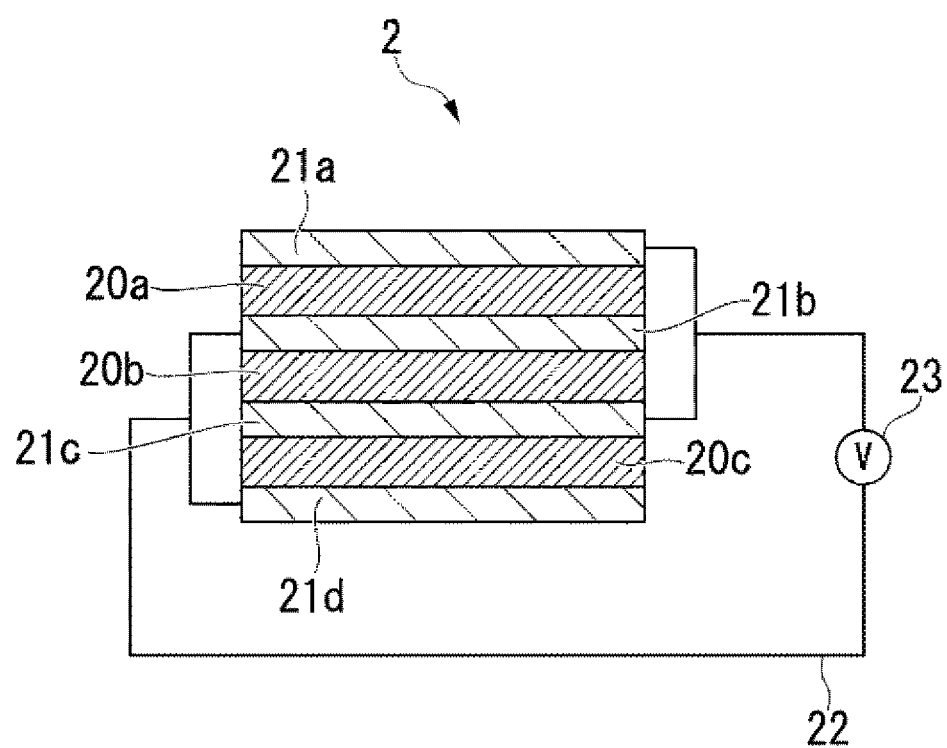

[FIG. 3]
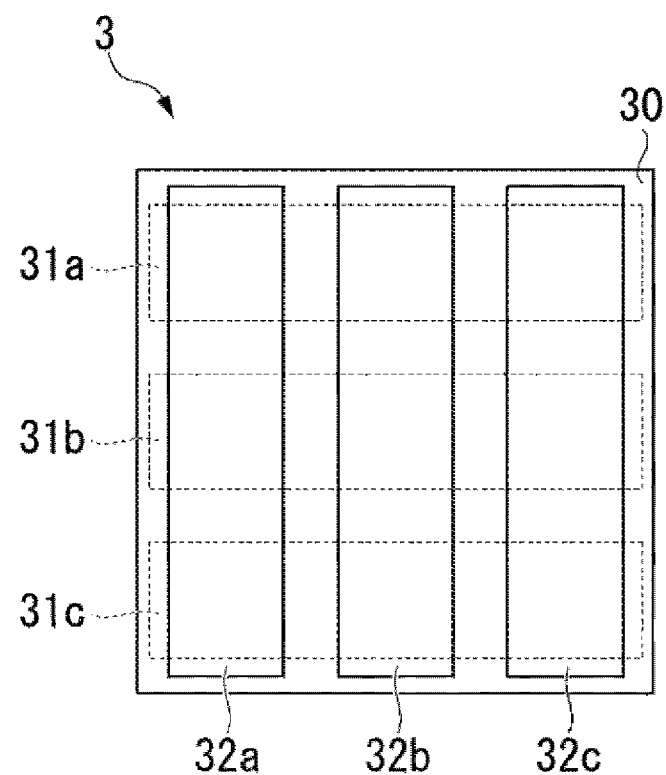

[FIG. 4]
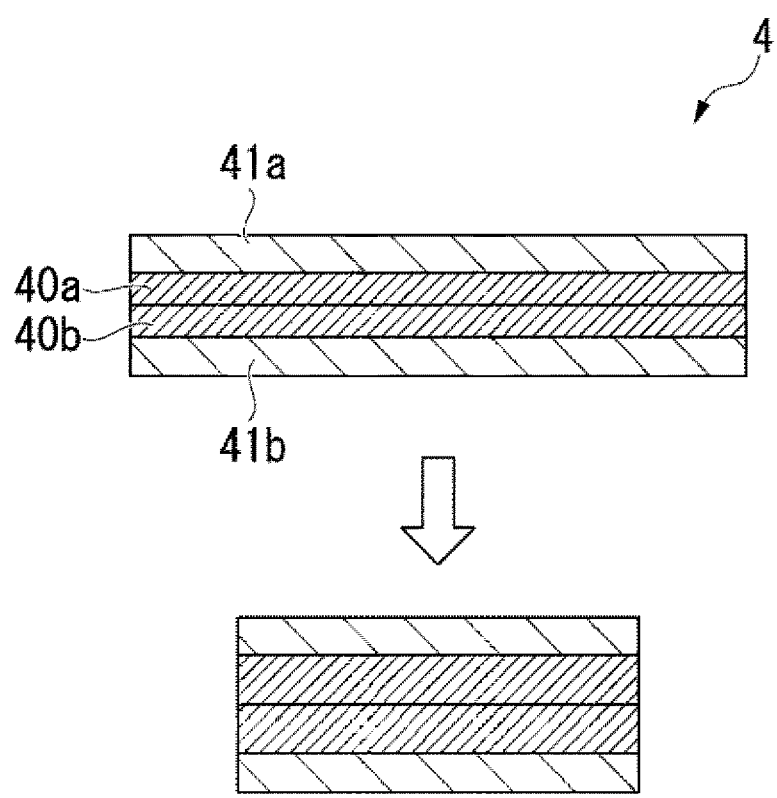

FLUOROALKYL GROUP-CONTAINING CURABLE ORGANOPOLYSILOXANE COMPOSITION, CURED PRODUCT THEREOF, AND TRANSDUCER OR THE LIKE PROVIDED WITH CURED PRODUCT

CROSS-REFERENCE TO RELATED APPLICATIONS

This application is the National Stage of International Appl. No. PCT/JP2018/017480 filed on 2 May 2018, which claims priority to Japanese Appl. No. 2017-099138 filed on 18 May 2017, the content of which is hereby incorporated by reference.

TECHNICAL FIELD

The present invention relates to a fluoroalkyl group-containing curable organopolysiloxane composition having a high dielectric constant and excellent electric properties as well as mechanical properties of a cured product, along with a cured product thereof, wherein this cured product can be suitably used for a dielectric layer such as a transducer, etc. as an electroactive silicone material. The present invention further relates to a method for manufacturing an electroactive polymer material using this curable organopolysiloxane composition, along with a transducer member, electronic material, or display apparatus member including the electroactive polymer material, in addition to relating to a transducer, electronic component, or display apparatus using the same.

BACKGROUND ART

Because electroactive silicone materials have mechanical properties and/or electric properties, specifically, a high specific dielectric constant, high dielectric breakdown strength, and a low Young's modulus, allowing for a high energy density to be achieved, in addition to having excellent mechanical strength (specifically, tensile strength, tear strength, elongation percentage, etc.) when used as a dielectric layer in a transducer, durability and a practical displacement amount can be realized while suitably using the electroactive silicone materials as transducer materials. For example, the present applicants disclose that a fluoroalkyl group-containing organopolysiloxane cured product has a high specific dielectric constant and is useful as a transducer material (Patent Document 1 or 2).

Unfortunately, in the field of transducer materials including actuators, there has been a recent demand for materials which can be easily processed into a film shape and further simultaneously achieve both a high specific dielectric constant and mechanical strength regarding electroactive silicone materials, with improved mechanical properties and electric properties strongly desired.

PRIOR ART DOCUMENTS

Patent Documents

[Patent Document 1] WO 2014-105959
[Patent Document 2] WO 2015-098072

SUMMARY OF THE INVENTION

Problems to be Solved by the Invention

The present invention has been created in order to solve the abovementioned problems, with an object of providing a fluoroalkyl group-containing curable organopolysiloxane composition which can be easily processed into a film shape and has a high specific dielectric constant, high dielectric breakdown strength, and a low Young's modulus, allowing for a high energy density to be achieved, in addition to having excellent mechanical strength (specifically, tensile strength, tear strength, elongation percentage, etc.) when used as a dielectric layer in a transducer.

Similarly, an object of the present invention is to provide an application of this fluoroalkyl group-containing organopolysiloxane composition as a transducer material such as an actuator.

Means for Solving the Problems

In order to solve the abovementioned problems, as a result of diligent research, the present inventors have found that the problems can be solved by a fluoroalkyl group-containing curable organopolysiloxane composition which can be cured by an addition reaction and which is obtained using: an organopolysiloxane as the main component containing an alkenyl group and a fluoroalkyl group; an organohydrogen polysiloxane as a crosslinking agent having at least two silicon atom-bonded hydrogen atoms at both terminals of a molecular chain but not having a fluoroalkyl group; and a linear fluoroalkyl group-containing organohydrogen polysiloxane or a branched fluoroalkyl group-containing organohydrogen polysiloxane having T units, leading to the present invention.

The cured product of this fluoroalkyl group-containing curable organopolysiloxane composition can be utilized as an electroactive silicone material having excellent mechanical properties and electric properties, particularly as a film shaped or sheet shaped transducer member.

The present inventors have further found that the abovementioned problems can be more suitably solved when the fluoroalkyl group is a trifluoropropyl group and further suitably solved when the organohydrogen polysiloxane is a linear organohydrogen polysiloxane having a trifluoropropyl group or a resinous organohydrogen polysiloxane having T units, per molecule, leading to the present invention.

That is, the first object of the present invention is achieved by:

[1] A fluoroalkyl group-containing curable organopolysiloxane composition, including: (A) one or two or more fluoroalkyl group-containing organopolysiloxanes which have at least two alkenyl groups having a carbon number of 2 to 12 per molecule, wherein 10 mol % or more of all substituent groups on silicon atoms are fluoroalkyl groups represented by $(C_pF_{2p+1})$—R— (wherein R is an alkylene group having a carbon atom number of 1 to 10, while p is an integer of 1 or more and 8 or less);
(B) an organohydrogen polysiloxane having the following components (B1) and (B2), wherein the ratio of the number of silicon atom-bonded hydrogen atoms in component (B1) to the number of silicon atom-bonded hydrogen atoms in component (B2) is within the range of 10:90 to 85:15;
(B1) an organohydrogen polysiloxane having at least two silicon atom-bonded hydrogen atoms at both terminals of a molecular chain and not having a fluoroalkyl group; and
(B2) one or more fluoroalkyl group-containing organohydrogen polysiloxanes selected from a linear organohydrogen polysiloxane represented by the following average unit formula (III) and a branched organohydrogen polysiloxane represented by the following average unit formula (IV):

$$R^0{}_3Si(OSiR^4R^0)_{f1}(OSiR^0{}_2)_{f2}OSiR^0{}_3 \qquad (III)$$

{wherein $R^4$ is a fluoroalkyl group represented by $(C_pF_{2p+1})$—R— (wherein R is the same group as described above, while p is the same number as described above) or a silicon atom-bonded hydrogen atom, $R^0$ is identically or independently an alkyl group having a carbon number of 1 to 12, an aryl group having a carbon number of 6 to 20, an aralkyl group having a carbon number of 7 to 20, a hydroxyl group, an alkoxy group having a carbon number of 1 to 6, or a silicon atom-bonded hydrogen atom, at least two of all $Rs^0$ are silicon atom-bonded hydrogen atoms, and f1 is a positive number, while f2 is 0 or a positive number, with each number satisfying 5<f1+f2<150};

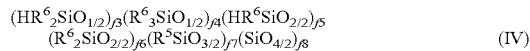
$$(HR^6{}_2SiO_{1/2})_{f3}(R^6{}_3SiO_{1/2})_{f4}(HR^6SiO_{2/2})_{f5}(R^6{}_2SiO_{2/2})_{f6}(R^5SiO_{3/2})_{f7}(SiO_{4/2})_{f8} \quad (IV)$$

{wherein $R^5$ is a fluoroalkyl group represented by $(C_pF_{2p+1})$—R— (R is the same group as described above, while p is the same number as described above), $R^6$ is identically or independently an alkyl group having a carbon number of 1 to 12, an aryl group having a carbon number of 6 to 20, an aralkyl group having a carbon number of 7 to 20, a hydroxyl group, an alkoxy group having a carbon number of 1 to 6, or the fluoroalkyl group, f3 and f7 are positive numbers, f4, f5, f6, and f8 are 0 or positive numbers, and f3+f4+f5+f6+f7+f8 is a number in which the weight average molecular weight of an organohydrogen polysiloxane represented by formula (III) is within the range of 400 to 10000,} wherein the sum of silicon atom-bonded hydrogen atoms in component (B) is an amount of 0.1 to 2.5 mol with respect to the total amount of one mol of an alkenyl group in a composition; and (C) an effective amount of a hydrosilylation reaction catalyst.

The first object of the present invention is preferably achieved by the following composition:

[2] The fluoroalkyl group-containing curable organopolysiloxane composition according to [1], wherein the average degree of polymerization of component (A) is within the range of 5 to 300.

[3] The fluoroalkyl group-containing curable organopolysiloxane composition according to [1] or [2], wherein (A) is an organopolysiloxane represented by the following average unit formula (I):

$$R^1R^2{}_2Si(OSiR^1R^2)_{e1}(OSiR^2{}_2)_{e2}OSiR^1R^2{}_2 \quad (I)$$

{wherein $R^1$ is a fluoroalkyl group represented by $(C_pF_{2p+1})$—R— (wherein R is the same group as described above, while p is the same number as described above) or an alkenyl group having a carbon number of 2 to 12, $R^2$ is identically or independently an alkyl group having a carbon number of 1 to 12, an aryl group having a carbon number of 6 to 20, an aralkyl group having a carbon number of 7 to 20, a hydroxyl group, or an alkoxy group having a carbon number of 1 to 6, and at least two of all $Rs^1$ are alkenyl groups having a carbon number of 2 to 12, 10 mol % or more of all $Rs^1$ and $Rs^2$ are the fluoroalkyl groups, e1 is a positive number, while e2 is 0 or a positive number, with each number satisfying 5<e1+e2<298.}

[4] The fluoroalkyl group-containing curable organopolysiloxane composition according to any one of [1] to [3], wherein (A) is an organopolysiloxane represented by the following average unit formula (II):

$$R^{n}R^2{}_2Si(OSiR^2R^3)_eOSiR^{n}R^2{}_2 \quad (II)$$

{wherein $R^n$ is an alkenyl group having a carbon number of 2 to 12, $R^2$ is the same group as described above, $R^3$ is a fluoroalkyl group represented by $(C_pF_{2p+1})$—R— (wherein R is the same group as described above, while p is the same number as described above), and e is a number satisfying 20<e<298.}

[5] The fluoroalkyl group-containing curable organopolysiloxane composition according to any one of [1] to [4], wherein, in component (A), a fluoroalkyl group represented by $(C_pF_{2p+1})$—R— (wherein R is the same group as described above, while p is the same number as described above) is a trifluoropropyl group.

[6] The fluoroalkyl group-containing curable organopolysiloxane composition according to any one of [1] to [5], wherein component (B2) is an organohydrogen polysiloxane having a trifluoropropyl group in each molecule.

[7] The fluoroalkyl group-containing curable organopolysiloxane composition according to any one of [1] to [6], wherein component (A) is the following component (A1) or (A2):

(A1) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— (wherein R is an alkylene group having a carbon atom number of 1 to 10, while p is an integer of 1 or more and 8 or less), the average degree of polymerization is 50 to 300, and the volume content ratio of the organopolysiloxane having a degree of polymerization of 200 or more is 10% or more; and (A2) a fluoroalkyl group-containing organopolysiloxane including the following components (a1) and (a2) having different molecular weight distributions, wherein the average degree of polymerization of the overall mixture is 50 to 300:

(a1) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— (wherein R is an alkylene group having a carbon atom number of 1 to 10, while p is an integer of 1 or more and 8 or less), and wherein the average degree of polymerization is 200 or more; and (a2) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— (wherein R is an alkylene group having a carbon atom number of 1 to 10, while p is an integer of 1 or more and 8 or less), and wherein the average degree of polymerization is 50 or less.

The second object of the present invention is a cured product obtained by curing the abovementioned fluoroalkyl group-containing curable organopolysiloxane composition, the use of the cured product as a transducer member, electronic material, or display apparatus member, and a transducer including the cured product, which is achieved by the following invention.

[8] A cured product obtained by curing the fluoroalkyl group-containing curable organopolysiloxane composition according to any one of [1] to [7].

[9] A film shaped or sheet shaped transducer member obtained by curing the fluoroalkyl group-containing curable organopolysiloxane composition according to any one of [1] to [7].

[10] A film shaped or sheet shaped electronic material or display apparatus member obtained by curing the fluoroalkyl group-containing curable organopolysiloxane composition according to any one of [1] to [7].

[11] A gel or elastomer transducer member obtained by curing the fluoroalkyl group-containing curable organopolysiloxane composition according to any one of [1] to [7].

[12] A transducer having a dielectric layer obtained by curing the fluoroalkyl group-containing curable organopolysiloxane composition according to any one of [1] to [7].

[13] A transducer, wherein an intermediate layer is interposed between at least a pair of electrode layers, with the transducer obtained by curing the fluoroalkyl group-containing curable organopolysiloxane composition according to any one of [1] to [7] or allowing the curing reaction of the composition to partially proceed.

[14] The transducer according to [12] or [13], wherein the intermediate layer is a gel or elastomer.

[15] The transducer according to any one of [12] to [14], wherein the intermediate layer is obtained by laminating one layer or two or more layers of a cured product obtained by curing the fluoroalkyl group-containing curable organopolysiloxane composition according to any one of [1] to [7].

[16] An electronic component or display apparatus having a cured product layer obtained by curing the fluoroalkyl group-containing curable organopolysiloxane composition according to any one of [1] to [7] or allowing the curing reaction of the composition to partially proceed.

Effects of the Invention

The present invention enables the provision of a fluoroalkyl group-containing curable organopolysiloxane composition which has the excellent transparency of a cured product and can be easily processed into a film shape and has a high specific dielectric constant, high dielectric breakdown strength, and a low Young's modulus, allowing for a high energy density to be achieved, in addition to having excellent mechanical strength when used as a dielectric layer in a transducer. This fluoroalkyl group-containing organopolysiloxane composition is an addition curing type, which advantageously contracts little during the molding process and has a high curing speed, and allows for desired curing conditions to be easily set. Moreover, the fluoroalkyl group-containing organopolysiloxane cured product according to the present invention has a high specific dielectric constant and further high mechanical strength (specifically, tensile strength, tear strength, elongation percentage, etc.) and because it realizes not only durability but also a practical displacement amount and high responsiveness when molded into a film shape or sheet shape and applied as the dielectric layer, it can be suitably used for the application as a transducer material such as an actuator.

BRIEF DESCRIPTION OF THE DRAWINGS

FIG. 1 is a cross sectional view of an actuator 1 according to the present invention when a dielectric layer is laminated.

FIG. 2 is a cross sectional view of an actuator 2 according to the present invention when a dielectric layer and an electrode layer are laminated.

FIG. 3 is a view illustrating the configuration of a sensor 3 according to the present invention.

FIG. 4 is a cross sectional view of a power generation element 4 according to the present invention when a dielectric layer is laminated.

MODE FOR CARRYING OUT THE INVENTION

The fluoroalkyl group-containing curable organopolysiloxane composition according to the present invention will hereinafter be described in detail. The fluoroalkyl group-containing curable organopolysiloxane composition according to the present invention contains the following components (A) to (C), and optionally, (D) a hydrosilylation reaction inhibitor and (E) a filler. Each component thereof will first be described.

Component (A)

Component (A) is the main agent of a curable composition which is a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— (wherein R is an alkylene group having a carbon atom number of 1 to 10, while p is an integer of 1 or more and 8 or less).

Component (A) has a certain amount or more of a fluoroalkyl group and at least two alkenyl groups per molecule. Therefore, the addition reaction (hydrosilylation reaction) thereof with component (B) induces crosslinking to yield a cured product which has excellent moldability, reaction controllability, and transparency, as well as a relatively high specific dielectric constant. While not particularly limited thereto, the structure may be a linear, branched, cyclic, or resinous organopolysiloxane having $R^3SiO_{3/2}$ units (trifunctional siloxy units) or $SiO_2$ units (tetrafunctional siloxy units) as essential units. Further, a mixture of one or two or more organopolysiloxanes having different molecular structures or average degrees of polymerization may be used. However, if it is applied as a dielectric layer of an actuator, etc., high mechanical strength is realized; in contrast, if low adhesion is required, it preferably does not contain the trifunctional siloxy units or tetrafunctional siloxy units. Component (A) is particularly suitably a linear fluoroalkyl group-containing organopolysiloxane.

Component (A) is a fluoroalkyl group, wherein 10 mol % or more, suitably 20 mol % or more, more suitably 40 mol % or more of all substituent groups on the silicon atoms are fluoroalkyl groups represented by $(C_pF_{2p+1})$—R— (wherein R is an alkylene group having a carbon atom number of 1 to 10, while p is an integer of 1 or more and 8 or less). If the content of a fluoroalkyl group is less than the lower limit, the specific dielectric constant of the cured product obtained by curing the curable organopolysiloxane composition unsuitably decreases. Note that if the content of fluorine atoms in a fluoroalkyl group represented by $(C_pF_{2p+1})$—R— is high, that is, p is a large value, for example, p≥4, and the carbon atom number of an alkylene group serving as R is small, the content of the fluoroalkyl group is a value close to the lower limit within the abovementioned range, allowing the technical effects of the present invention to be exerted. Specifically, the content ratio of fluorine atoms of component (A) is preferably 10 mass % or more. Note that if a trifluoropropyl group is selected as a fluoroalkyl group, all substituent groups on silicon atoms in component (A) can be 40 mol % or more.

A fluoroalkyl group represented by $(C_pF_{2p+1})$—R— is an essential functional group in component (A) according to the present invention, as well as a suitable functional group in component (B). Such a fluoroalkyl group yields a cured product having an excellent specific dielectric constant, in addition to yielding a cured product in which each component has fluorine atoms, with each component having improved compatibility, giving the cured product excellent transparency. Specific examples of such a fluoroalkyl group include a trifluoropropyl group, a pentafluorobutyl group, a heptafluoropentyl group, a nonafluorohexyl group, an undecafluoroheptyl group, tridecafluorooctyl group, a pentadecafluorononyl group, and a heptadecafluorodecyl group. Among these, in terms of the dielectric properties, economy, ease of manufacturing, and moldability of the obtained curable organopolysiloxane composition, a group in which p=1, that is, a trifluoropropyl group, is preferred.

Component (A) has at least two alkenyl groups having a carbon number of 2 to 12 per molecule. As an alkenyl group having a carbon number of 2 to 12, in terms of economy and reactivity, a vinyl group, an allyl group, a hexenyl group, and an octenyl group are preferably used, with a vinyl group and a hexenyl group more preferably used. While not particularly limited thereto, other silicon atom-bonded functional groups in component (A) include an alkyl group having a carbon number of 1 to 12, an aryl group having a carbon number of 6 to 20, an aralkyl group having a carbon number of 7 to 20, a hydroxyl group, or an alkoxy group having a carbon number of 1 to 6. As an alkyl group having a carbon number of 1 to 12, a methyl group is preferable, taking economy and heat resistance into consideration. As an aryl group having a carbon number of 6 to 20, a phenyl group, methylphenyl(tolyl) group, and a naphthyl group are preferable in terms of economy. A benzyl group and a phenethyl group are preferably used as an aralkyl group having a carbon number of 7 to 20. A methoxy group, an ethoxy group, and an n-propoxy group are further preferable as an alkoxy group having a carbon number of 1 to 6. Note that a certain amount or more of all substituent groups on silicon atoms in component (A) are the fluoroalkyl group, with two or more alkenyl groups having a carbon number of 2 to 12 per molecule, while other silicon atom-bonded functional groups are preferably a methyl group, a phenyl group, or a hydroxyl group, and are particularly preferably selected from a methyl group and a phenyl group.

The average degree of polymerization of component (A) according to the present invention is not limited. In terms of the handleability of a composition prior to curing and the mechanical strength of the cured product, the average degree of polymerization of the siloxane units (hereinafter, simply referred to as the "average degree of polymerization") may be less than 500, less than 450, less than 400, less than 350, or less than 300. Similarly, while not limited thereto, the lower limit of the average degree of polymerization may be 7 or more, 10 or more, 15 or more, or 20 or more. Moreover, component (A) may be a mixture of the fluoroalkyl group-containing organopolysiloxane having different average degrees of polymerization, wherein, for example, a mixture of the fluoroalkyl group-containing organopolysiloxane having a relatively low degree of polymerization (ex. 10 to 90) and the fluoroalkyl group-containing organopolysiloxane having a relatively high degree of polymerization (ex. 100 to 300) (the below-mentioned peak shape of the molecular weight distribution is multimodal) may be used. In this case, the average degree of polymerization of siloxane units of component (A) is determined based on the degree of polymerization and mass ratio of each fluoroalkyl group-containing organopolysiloxane making up the mixture.

Particularly suitably, the average degree of polymerization of component (A) is within the range of 10 to 300, preferably 15 to 250, allowing a gelled or elastomeric cured product molded into a film/sheet shape to be easily obtained, with this cured product exhibiting good mechanical properties and electric properties (high specific dielectric constant). Note that the abovementioned physical properties of the cured product according to the present invention hardly change, for example, at a temperature of 0° C. or lower and therefore may realize stable performance over a wide temperature range.

Here, the degree of polymerization of the organopolysiloxane serving as component (A) can be determined based on the integration ratio of the peak strength using $^{29}$Si NMR, wherein the "average degree of polymerization" in the present invention refers to the overall average degree of polymerization if one or more molecular weight distributions are present in component (A). Component (A) may be an organopolysiloxane having a single molecular weight distribution or a mixture consisting of two or more organopolysiloxanes having different molecular weight distributions, wherein the peak shape of the molecular weight distribution may be unimodal or multimodal. Note that in the quantitative range in which the average degree of polymerization is within the range, if two or more fluoroalkyl group-containing organopolysiloxanes are used in combination, the selectability of the raw material in the composition design may expand, further improving the physical properties of the cured product consisting of the composition according to the present invention.

Component (A) is particularly suitably one or more linear organopolysiloxanes which are represented by average unit formula (I) and have a certain amount or more of fluoroalkyl groups along with at least two alkenyl groups.

Average unit formula:

$$R^1R^2{}_2Si(OSiR^1R^2)_{e1}(OSiR^2{}_2)_{e2}OSiR^1R^2{}_2 \qquad (I)$$

In the formula, substituent groups represented by $R^1$ are identically or independently a fluoroalkyl group or an alkenyl group having a carbon number of 2 to 12, with specific examples thereof being the same as described above. Moreover, substituent groups represented by $R^2$ are identically or independently an alkyl group having a carbon number of 1 to 12, an aryl group having a carbon number of 6 to 20, an aralkyl group having a carbon number of 7 to 20, a hydroxyl group, or an alkoxy group having a carbon number of 1 to 6, wherein at least two of all $Rs^1$ are alkenyl groups having a carbon number of 2 to 12. The content of an alkenyl group having a carbon number of 2 to 12 in component (A) may suitably be 0.01 to 10.00 mass %, 0.01 to 2.00 mass %, or 0.02 to 1.50 mass %. Moreover, $R^2$ is preferably a methyl group, a phenyl group, or a hydroxyl group, particularly preferably a methyl group or a phenyl group.

Further, 10 mol % or more, suitably 20 mol % or more, more suitably 40 mol % or more of all substituent groups ($R^1$ and $R^2$) on all silicon atoms are the fluoroalkyl groups, suitably trifluoropropyl groups. If the content of a fluoroalkyl group is less than the lower limit, the specific dielectric constant of the cured product obtained by curing the curable organopolysiloxane composition unsuitably decreases.

In the formula, the values of e1 and e2 are the average degree of polymerization of each siloxane unit in component (A), wherein e1 is a positive number, while e2 is 0 or a positive number, with these number preferably satisfying 5<e1+e2<498. Note that if these values are the average degree of polymerization and component (A) is a mixture including two or more components, the average degree of polymerization e1+e2+2 of component (A) as the overall mixture is preferably less than 500, with other values being the same as the suitable range of the average degree of polymerization of the abovementioned component (A). The degree of polymerization of the organopolysiloxane serving as component (A) can be determined by the integration ratio of the peak strength using $^{29}$Si NMR, while the suitable range of the average degree of polymerization is the same as described above.

Component (A) according to the present invention may be a single organopolysiloxane satisfying the requirements or a mixture of at least two organopolysiloxanes. In the case of at least two organopolysiloxanes, they are organopolysiloxanes in which the average degree of polymerization of the mixture thereof is preferably within the range, wherein each organopolysiloxane preferably has two or more alkenyl groups having a carbon number of 2 to 12 per molecule, while 10 mol % or more of all substituent groups on silicon atoms are more preferably the fluoroalkyl group.

In component (A) according to the present invention, the fluoroalkyl group may be disposed on a side chain on a terminal of a molecular chain, but is particularly suitably a homopolymer type organopolysiloxane which is represented by the below-mentioned average unit formula (II), has the fluoroalkyl group on a side chain, and has an alkenyl group having a carbon number of 2 to 12 at both terminals of a molecular chain.

Average unit formula:

$$R^{vi}R^2{}_2Si(OSiR^2R^3)_eOSiR^{vi}R^2{}_2 \quad (II)$$

In the formula, $R^{vi}$ is an alkenyl group having from 2 to 12 carbon atoms, examples of which include the same groups as those described above.

$R^2$ is the same group as described above, while $R^3$ is a fluoroalkyl group represented by $(C_pF_{2p+1})$—R— (wherein R is the same group as described above, while p is the same number as described above), with examples thereof including the same group as described above. Note that in the abovementioned structure, the conditions that 10 mol % or more of all $Rs^{vi}$, $Rs^2$, and $Rs^3$ are the fluoroalkyl groups ($R^3$) within the range of $5<e<498$ are automatically satisfied. That is, because $e>5$, the value of $[R^3]=e/(2e+6)\times100$ mol % is necessarily larger than $5/16\times100=31.25$ mol %.

$R^{vi}$ is suitably a vinyl group or a hexenyl group, $R^2$ is suitably a methyl group, a phenyl group, or a hydroxyl group, and the fluoroalkyl group is suitably a trifluoropropyl group.

In the formula, the value of e is the average degree of polymerization of side chain siloxane units in component (A), and is 0 or a positive number, preferably satisfying $5<e<498$. Note that if these values are the average degree of polymerization and component (A) is a mixture consisting of two or more components, the average degree of polymerization e+2 as the overall mixture component (A) is less than 500. The degree of polymerization of the organopolysiloxane serving as component (A) can be determined by the integration ratio of the peak strength using $^{29}Si$ NMR, while the suitable range of the average degree of polymerization is the same as described above.

Specific examples of component (A) according to the present invention include a trimethylsilyl-polydimethylmethylvinylmethyltrifluoropropylsiloxane copolymer at both terminals, trimethylsilyl-polymethylvinylmethyltrifluoropropylsiloxane copolymer at both terminals, dimethylvinylsilyl-polydimethylmethylvinylmethyltrifluoropropylsiloxane copolymer at both terminals, dimethylvinylsilyl-polydimethylmethyltrifluoropropylsiloxane copolymer at both terminals, hydroxydimethylsilyl-polymethylvinylmethyltrifluoropropylsiloxane copolymer at both terminals, hydroxydimethylsilyl-polydimethylmethylvinylmethyltrifluoropropylsiloxane copolymer at both terminals, dimethylphenylsilyl-polymethylvinylmethyltrifluoropropylsiloxane copolymer at both terminals, dimethylphenylsilyl-polydimethylmethylvinylmethyltrifluoropropylsiloxane copolymer at both terminals, dimethylvinylsilyl-polydimethylmethylvinylmethylphenylmethyltrifluoropropylsiloxane copolymer at both terminals, dimethylvinylsilyl-polymethylphenylmethyltrifluoropropylsiloxane copolymer at both terminals, dimethylvinylsilyl-polydimethylmethylphenylmethyltrifluoropropylsiloxane copolymer at both terminals, hydroxydimethylsilyl-polymethylvinylmethylphenylmethyltrifluoropropylsiloxane copolymer at both terminals, hydroxydimethylsilyl-polydimethylmethylvinylmethylphenylmethyltrifluoropropylsiloxane copolymer at both terminals, dimethylvinylsilyl-polymethyltrifluoropropylsiloxane at both terminals, etc.

The molecular weight distribution of component (A) according to the present invention is as described above, wherein an organopolysiloxane may have a substantially unimodal peak shaped molecular weight distribution with an average degree of polymerization of less than 500 or, alternatively, may have a substantially multimodal (=having two or more peaks in the molecular weight distribution) peak shaped molecular weight distribution with an average degree of polymerization of less than 500.

More specifically, component (A) according to the present invention may be the following component (A1) or (A2).

Component (A1)

A fluoroalkyl group-containing organopolysiloxane which has a substantially unimodal molecular weight distribution, has at least two alkenyl groups having a carbon number of 2 to 12 per molecule, wherein 10 mol % or more of all substituent groups on silicon atoms are fluoroalkyl groups represented by $(C_pF_{2p+1})$—R— (wherein R is an alkylene group having a carbon atom number of 1 to 10, while p is an integer of 1 or more and 8 or less), the average degree of polymerization is 50 to 300, and the volume content ratio of the organopolysiloxane having a degree of polymerization of 200 or more is 10% or more. Specific examples of alkenyl groups, etc. are the same as those described above.

Component (A2)

A fluoroalkyl group-containing organopolysiloxane including the following components (a1) and (a2) having different molecular weight distributions and average degrees of polymerization, wherein the average degree of polymerization of the overall mixture is 50 to 300:

(a1) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— (wherein R is an alkylene group having a carbon atom number of 1 to 10, while p is an integer of 1 or more and 8 or less), and wherein the average degree of polymerization is 200 or more, suitably within the range of 200 to 400; and (a2) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— (wherein R is an alkylene group having a carbon atom number of 1 to 10, while p is an integer of 1 or more and 8 or less), and wherein the average degree of polymerization is 50 or less, suitably within the range of 5 to 40.

Here, component (A2) is: (a1) one or more fluoroalkyl group-containing organopolysiloxane having an average degree of polymerization of 200 or more; and (a2) one or more fluoroalkyl group-containing organopolysiloxanes having an average degree of polymerization of 50 or less, wherein, when the molecular weight distribution is measured as a whole, this induces a mixture of fluoroalkyl group-containing organopolysiloxanes having a multimodal molecular weight distribution with molecular weight distribution peaks of a region having an average degree of polymerization 50 or less and a region having an average degree of polymerization of 200 or more, respectively. Note that the average degree of polymerization of the overall mixture is preferably within the range of 50 to 300, with a suitable range of the average degree of polymerization as a whole being the same as described above.

The amount of component (A) used according to the present invention is an amount of 20 to 99 mass %, suitably 30 to 80 mass %, more suitably 40 to 70 mass %, with respect to the sum (100 mass % as a whole) of components (A) to (C). If it is the upper limit or less of the abovementioned range, the dynamic strength of the cured product obtained by curing the present composition is sufficiently high; in contrast, if it is the lower limit or more of the abovementioned, this cured product suitably functions as an elastic gel layer having low adhesion.

Component (B)

Component (B) is a characteristic crosslinking agent of the composition according to the present invention, has at least two silicon atom-bonded hydrogen atoms at both terminals of a molecular chain, and is an organohydrogen polysiloxane containing, at a specific ratio: an organohydrogen polysiloxane not having a fluoroalkyl group; and a linear fluoroalkyl group-containing organohydrogen polysiloxane or a branched fluoroalkyl group-containing organohydrogen polysiloxane having T units. When, as component (B), an organohydrogen polysiloxane having SiH at both terminals and not having a fluoroalkyl group is used in combination with a fluoroalkyl group-containing organohydrogen polysiloxane at a certain ratio, a high specific dielectric constant and good mechanical properties of the cured product can be simultaneously satisfied.

Specifically, component (B) is an organohydrogen polysiloxane having the following components (B1) and (B2), wherein the ratio of the number of silicon atom-bonded hydrogen atoms in component (B1) to the number of silicon atom-bonded hydrogen atoms in component (B2) is within the range of 10:90 to 85:15;

Component (B1)

Component (B1) is an organohydrogen polysiloxane having at least two silicon atom-bonded hydrogen atoms at both terminals of a molecular chain and not having a fluoroalkyl group. Because component (B1) is an organohydrogen polysiloxane having SiH at both terminals, component (B1) is a component which functions as a chain extender between polysiloxane structures in the cured product due to the addition reaction with component (A). Such component (B1) is preferably an organohydrogen polysiloxane having diorganohydrogen siloxy units at both terminals of a molecular chain and having a siloxane degree of polymerization of 3 to 200, and is represented by, for example, the following average unit formula:

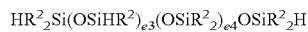

In the formula, substituent groups represented by $R^2$ represented by substituent groups are identically or independently an alkyl group having a carbon number of 1 to 12, an aryl group having a carbon number of 6 to 20, an aralkyl group having a carbon number of 7 to 20, a hydroxyl group, or an alkoxy group having a carbon number of 1 to 6, preferably a methyl group, a phenyl group, or a hydroxyl group, particularly preferably a methyl group or a phenyl group. In the formula, the values of e3 and e4, the average degree of polymerization of each siloxane unit in component (B1) indicated by the abovementioned average unit formula, are 0 or a positive number, wherein the value of e3+e4 is preferably within the range of 0 to 198, particularly preferably within the range of 0 to 10.

Exemplary components (B1) include bis(dimethylhydrogensiloxy)diphenylsilane, a polydiphenylsiloxane or hydrogen siloxane copolymer blocked with a dimethylhydrogen siloxy group at both terminals of a molecular chain, a polydimethylsiloxane or hydrogen siloxane copolymer blocked with a dimethylhydrogen siloxy group at both terminals of a molecular chain, tetramethyldihydrogen disiloxane, etc. Note that the sum of the number of siloxane units or siloxy units in component (B1) is preferably within the range of 2 to 12, particularly preferably within the range of 2 to 10.

Component (B2)

Component (B2) is a linear fluoroalkyl group-containing organohydrogen polysiloxane or a branched resinous fluoroalkyl group-containing organohydrogen polysiloxane derived from T units and is represented by the following average unit formula (III) or (IV). Such an organohydrogen polysiloxane yields the cured product due to the crosslinking reaction with component (A), in addition to improving the specific dielectric constant of the cured product. An organohydrogen polysiloxane serving as such component (B2) preferably has a fluoroalkyl group, particularly preferably has a trifluoropropyl group, in each molecule. While not particularly limited thereto, the content of a fluoroalkyl group may preferably have 5 to 75 mol %, more preferably 5 to 70 mol %, and further preferably 10 to 60 mol % trifluoropropyl groups among all organic groups in each molecule.

Component (B2)-1: linear fluoroalkyl group-containing organohydrogen polysiloxane Average unit formula:

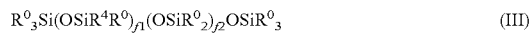

A linear a fluoroalkyl group-containing organohydrogen polysiloxane is represented by the abovementioned average unit formula (III), wherein $R^4$ is a fluoroalkyl group represented by $(C_pF_{2p+1})$—R— (wherein R is the same group as described above, while p is the same number as described above) or a silicon atom-bonded hydrogen atom, $R^0$ is identically or independently an alkyl group having a carbon number of 1 to 12, an aryl group having a carbon number of 6 to 20, an aralkyl group having a carbon number of 7 to 20, a hydroxyl group, an alkoxy group having a carbon number of 1 to 6, or a silicon atom-bonded hydrogen atom, at least two of all $Rs^0$ are silicon atom-bonded hydrogen atoms, and f1 is a positive number, while f2 is 0 or a positive number, with each number satisfying 5<f1+f2<150. The type and content of suitable fluoroalkyl groups are as described above. $R^0$ is more suitably a silicon atom-bonded hydrogen atom, a methyl group, or a phenyl group, wherein f1 is a number within the range of 10<f1+f2<100 and at least 5 mol % or more of all $Rs^4$ are preferably fluoroalkyl groups, while the remaining $Rs^4$ are preferably silicon atom-bonded hydrogen atoms.

Specific examples of such component (B2) include a trimethylsilyl-polydimethylmethylhydrogen methyltrifluoropropylsiloxane copolymer at both terminals, trimethylsilyl-polymethylhydrogen methyltrifluoropropylsiloxane copolymer at both terminals, dimethylhydrogen silyl-polydimethylmethyltrifluoropropylsiloxane copolymer at both terminals, dimethylhydrogen silyl-polymethylhydrogen methyltrifluoropropylsiloxane copolymer at both terminals, dimethylhydrogen silyl-polydimethylmethylhydrogen methyltrifluoropropylsiloxane copolymer at both terminals, dimethylhydrogen silyl-polymethyltrifluoropropylsiloxane at both terminals, hydroxydimethylsilyl-polymethylhydrogen methyltrifluoropropylsiloxane copolymer at both terminals, hydroxydimethylsilyl-polydimethylmethylhydrogen methyltrifluoropropylsiloxane copolymer at both terminals, dimethylphenylsilyl-polymethylhydrogen methyltrifluoropropylsiloxane copolymer at both terminals, dimethylphenylsilyl-polydimethylmethylhydrogen methyltrifluoropropylsiloxane copolymer at both terminals, dimethylhydrogen silyl-polydimethylmethylphenylmethyltrifluoropropylsiloxane copolymer at both terminals, dimethylhydrogen silyl-polymethylphenylmethyltrifluoropropylsiloxane copolymer at both terminals, hydroxydimethylsilyl-polymethylhydrogen methylphenylmethyltrifluoropropylsiloxane copolymer at both terminals, dimethyltrifluoropropylsilyl-polydimethylmethylhydrogen siloxane copolymer at both terminals, dimethyltrifluoropropylsilyl-polymethylhydrogen siloxane at both terminals, etc. One of these may be used independently or a mixture of at least two or more organopolysiloxanes may be used.

Component (B2)-2: branched fluoroalkyl group-containing organohydrogen polysiloxane Average unit formula:

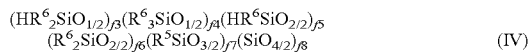

$(HR^6_2SiO_{1/2})_{f3}(R^6_3SiO_{1/2})_{f4}(HR^6SiO_{2/2})_{f5}$
$(R^6_2SiO_{2/2})_{f6}(R^5SiO_{3/2})_{f7}(SiO_{4/2})_{f8}$ (IV)

A resinous fluoroalkyl group-containing organohydrogen polysiloxane branched in T units is represented by the abovementioned average unit formula (IV), wherein $R^5$ is a fluoroalkyl group represented by $(C_pF_{2p+1})$—R— (R is the same group as described above, while p is the same number as described above), $R^6$ is identically or independently an alkyl group having a carbon number of 1 to 12, an aryl group having a carbon number of 6 to 20, an aralkyl group having a carbon number of 7 to 20, a hydroxyl group, an alkoxy group having a carbon number of 1 to 6, or the fluoroalkyl group, f3 and f7 are positive numbers, f4, f5, f6, and f8 are 0 or positive numbers, and f3+f4+f5+f6+f7+f8 is a number in which the weight average molecular weight of an organohydrogen polysiloxane represented by formula (IV) is within the range of 400 to 10000. The type and content of suitable fluoroalkyl groups are as described above. $R^6$ is suitably a methyl group or a phenyl group, wherein the weight average molecular weight of an organohydrogen polysiloxane indicated by formula (IV) is preferably within the range of 500 to 5000, suitably within the range of 500 to 2000.

Specifically, the abovementioned branched fluoroalkyl group-containing organohydrogen polysiloxane is preferably a fluoroalkyl group-containing organohydrogen polysiloxane represented by the following formula and made up of diorganohydrogen siloxy units and fluoroalkyl siloxy units.

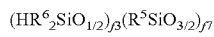

$(HR^6_2SiO_{1/2})_{f3}(R^5SiO_{3/2})_{f7}$

In the formula, $R^6$ is the same group as described above, suitably a methyl group or a phenyl group. Moreover, $R^5$ is the same group as described above, suitably a trifluoropropyl group.

Specific examples of such a component (B2) include: a polysiloxane consisting of $(Me_3SiO_{1/2})$ units, $(Me_2HSiO_{1/2})$ units, and $(TfpSiO_{3/2})$ units; a polysiloxane consisting of $(Me_2HSiO_{1/2})$ units and $(TfpSiO_{3/2})$ units; a polysiloxane consisting of $(Me_3SiO_{1/2})$ units, $(MeHSiO_{2/2})$ units, and $(TfpSiO_{3/2})$ units; a polysiloxane consisting of $(Me_2HSiO_{1/2})$ units, $(MeHSiO_{2/2})$ units, and $(TfpSiO_{3/2})$ units; a polysiloxane consisting of $(Me_2HSiO_{1/2})$ units, $(TfpSiO_{3/2})$ units, and $(MeSiO_{3/2})$ units; a polysiloxane consisting of $(Me_2HSiO_{1/2})$ units, $(TfpSiO_{3/2})$ units, and $(PhSiO_{3/2})$ units; a polysiloxane consisting of $(Me_2HSiO_{1/2})$ units, $(TfpSiO_{3/2})$ units, and $(SiO_{4/2})$ units; etc. One of these may be used independently or a mixture of at least two or more organopolysiloxanes may be used. Here, Me represents a methyl group, Ph represents a phenyl group, and Tfp represents a trifluoropropyl group. Component (B2) is most suitably a fluoroalkyl group-containing organohydrogen polysiloxane consisting of $(Me_2HSiO_{1/2})$ units and $(TfpSiO_{3/2})$ units, including these units at a ratio of 2:1 to 1:2, with the weight average molecular weight within a range of 500 to 2000.

Other Organohydrogenpolysiloxanes

Component (B) according to the present invention consists of the abovementioned components (B1) and (B2), but may optionally use other organohydrogen polysiloxanes as long as it does not inhibit the effects of the present invention. As long as other organohydrogen polysiloxanes do not correspond with the abovementioned components (B1) and (B2), the polysiloxanes may be linear, cyclic, resinous, or partially branched linear and may have T units (that is, $YSiO_{3/2}$, Y silicon atom-bonded hydrogen atoms, a monovalent organic group, a hydroxyl group, or an alkoxy group) or Q units (that is, $SiO_{4/2}$). Moreover, the viscosity thereof is not particularly limited. In terms of the ease of mixing and ease of handling with component (A), the viscosity at 25° C. is preferably in a liquid state at normal temperature when measured using a B type viscometer in accordance with JIS K7117-1, particularly suitably an organohydrogen polysiloxane having a number of silicon atoms of 2 to 300.

Examples of other organohydrogen polysiloxanes include a trimethylsilyl-polymethylhydrogen siloxane at both terminals, a hydroxydimethylsilyl-polymethylhydrogen methylphenylsiloxane copolymer at both terminals, a dimethylmethylhydrogen cyclopolysiloxane, a methylhydrogen cyclopolysiloxane, a methylhydrogen a methyltrifluoropropylcyclopolysiloxane, a dimethylmethylhydrogen methyltrifluoropropylcyclopolysiloxane, a methylphenylmethylhydrogen methyltrifluoropropylcyclopolysiloxane, a 1,1,3,5,5-pentamethyl-3-trifluoropropyltrisiloxane, a tris(dimethylsiloxysilyl)trifluoropropylsilane, a polysiloxane consisting of $(Me_3SiO_{1/2})$ units, $(Me_2HSiO_{1/2})$ units, and $(SiO_{4/2})$ units, a polysiloxane consisting of $(Me_2HSiO_{1/2})$ units and $(SiO_{4/2})$ units, a polysiloxane consisting of $(Me_2HSiO_{1/2})$ units and $(PhSiO_{3/2})$ units, etc. One of these may be used independently or a mixture of at least two or more organopolysiloxanes may be used. Here, Me represents a methyl group, while Ph represents a phenyl group.

Amount of Component (B) Used

The amount of component (B) used in the composition according to the present invention is an amount such that the total sum of silicon atom-bonded hydrogen atoms in overall component (B), that is, components (B1) and (B2), is 0.1 to 2.5 mol with respect to the total amount of an alkenyl group of 1 mol in the composition. Here, the alkenyl group in the composition is mainly derived from component (A), etc. If the amount of component (B) used is less than the abovementioned lower limit, the present composition may be insufficiently cured. In contrast, if the amount of component (B) used exceeds the abovementioned upper limit, when the composition according to the present invention is cured, an elastic gel or an elastic elastomer may not be obtained and, specifically, the mechanical strength may be insufficient. A more suitable amount of component (B) used is an amount such that silicon atom-bonded hydrogen atoms in the present component are 0.2 to 2.00 mol, 0.2 to 1.80 mol, 0.25 to 1.75 mol, and further suitably 0.35 to 1.50 mol, with respect to the total amount of an alkenyl group of 1 mol in the composition.

Component (C)

A hydrosilylation reaction catalyst serving as component (C) is not limited to a specific catalyst, so long as a hydrosilylation reaction can be promoted. Many metals and compounds are currently known as hydrosilylation reaction catalysts, which can be appropriately selected and used in the present invention. Specific examples of the hydrosilylation reaction catalyst can include fine particulate platinum adsorbed on silica fine powder or a carbon powder carrier, chloroplatinic acids, alcohol-modified chloroplatinic acids, olefin complexes of a chloroplatinic acid, coordinate compounds of a chloroplatinic acid and vinyl siloxane, a platinum-alkenyl siloxane complex, a platinum-olefin complex, a platinum-carbonyl complex, platinum black, palladium, and rhodium catalysts. In particular, 1,3-divinyl-1,1,3,3-tetramethyldisiloxane is preferable because the platinum-alkenyl siloxane complex has good stability. As the catalyst for promoting the hydrosilylation reaction, a non-platinum based metal catalyst such as iron, ruthenium, iron/cobalt, or the like may be used.

The amount of a catalyst used for a hydrosilylation reaction is an effective amount but is not particularly limited as long as it promotes the curing of the curable organopolysiloxane composition according to the present invention. Specifically, with respect to the sum (100 mass % as a whole) of components (A) to (C), in mass units, the metal atoms in this catalyst are of an amount within the range of 0.01 to 1,000 ppm, while the platinum metal atoms in component (C) are suitably of an amount within the range of 0.1 to 500 ppm. This is because, when the content of component (C) is less than the lower limit within the abovementioned range, curing may be insufficient; in contrast, if it exceeds the abovementioned upper limit, it is generally uneconomical.

(D) Hydrosilylation Reaction Inhibitor

A hydrosilylation reaction inhibitor is any component which is blended to inhibit the crosslinking reaction occurring between components (A) and (B), extend work life at normal temperatures, and improve storage stability. Therefore, for practical purposes, the curable composition according to the present invention is a preferable component when necessarily blended.

Specific examples of the hydrosilylation reaction inhibitor include acetylenic compounds, ene-yne compounds, organic nitrogen compounds, organic phosphorus compounds, and oxime compounds. Specific examples include alkyne alcohols such as 3-methyl-1-butyne-3-ol, 3,5-dimethyl-1-hexyne-3-ol, 3-methyl-1-pentyne-3-ol, 1-ethynyl-1-cyclohexanol, and phenyl butanol; ene-yne compounds such as 3-methyl-3-pentene-1-yne and 3,5-dimethyl-1-hexyne-3-yne; methylalkenylcyclosiloxanes such as 1,3,5,7-tetramethyl-1,3,5,7-tetravinylcyclotetrasiloxane and 1,3,5,7-tetramethyl-1,3,5,7-tetrahexenylcyclotetrasiloxane; and benzotriazoles.

The blending amount of the hydrosilylation reaction inhibitor is an amount to effectively extend the work life at normal temperatures of the fluoroalkyl group-containing curable organopolysiloxane composition according to the present invention and improve the storage stability. Normally, it is within the range of 0.001 to 5 mass % and preferably within the range of 0.01 to 2 mass % per 100 mass % of component (A), but may be appropriately selected in accordance with the type of the present component, the performance and content of a platinum based catalyst, the amount of an alkenyl group in component (A), the amount of silicon atom-bonded hydrogen atoms in component (B), etc.

(E) Filler

In the composition according to the present invention, a filler may or may not be used as required. If a filler is used, either or both of the inorganic filler and the organic filler can be used. While not particularly limited thereto, exemplary types of fillers used include a high dielectric filler, a conductive filler, an insulating filler, and a reinforcing filler, with one or more of these capable of being used. Specifically, the composition according to the present invention may contain one or more fillers selected from a high dielectric filler, a conductive filler, an insulating filler, and a reinforcing filler in order to adjust the viscosity and impart functionality as long as it does not impair the transparency, coatability, and handleability, with at least one or more reinforcing fillers particularly preferably blended in terms of improving mechanical strength. Specifically, a portion of or the entire filler may be surface treated with one or more surface treating agents.

One or two or more fillers may be used, the shape of which is not particularly limited, with any shape including a particle shape, plate shape, needle shape, or fibrous shape capable of being used. If the shape of the filler is particulate, the particle diameter of the filler is not particularly limited, such that, for example, if it is measured using a laser beam diffraction method and a dynamic light scattering method, the volume average particle diameter can be, for example, within the range of 0.001 to 500 μm. Moreover, depending on the intended purpose of the filler, the volume average particle diameter of the filler can be 300 μm or less, 200 μm or less, 100 μm or less, 10 μm or less, 0.01 μm or more, 0.1 μm or more, or 1 μm or more. If the shape of the filler is an anisotropic shape such as a plate shape, needle shape, or fibrous shape, the aspect ratio of the filler can be 1.5 or more, 5 or more, or 10 or more. If fine particles having a volume average particle diameter of 0.01 μm or less and a particle diameter of the maximum particle of 0.02 μm or less are used, a cured product having substantially high transparency, specifically a dielectric layer film, can be manufactured.

Reinforcing Filler

In the present invention, in terms of the mechanical strength of the cured product, a preferable filler is one or more reinforcing inorganic fine particles having an average primary particle diameter of less than 50 nm, with examples thereof including fumed silica, wet silica, ground silica, calcium carbonate, diatomaceous earth, finely ground quartz, various metal oxide powders other than alumina/zinc oxide, glass fibers, carbon fibers, etc. Moreover, these may be treated with the below-mentioned various surface treating agents. Among these, silica is recommended.

Preferred examples thereof include hydrophilic or hydrophobic fumed silica in which, in order to improve mechanical strength, the average primary particle diameter is 10 nm or less, they are partially aggregated, and the specific surface area is 50 m$^2$/g or more and 300 m$^2$/g or less. Further, in order to improve dispersibility, fumed silica is preferably treated with silazane or the below-mentioned silane coupling agent. One of these reinforcing inorganic particles may be used independently or two or more thereof may be used in combination.

When reinforcing inorganic fine particles are blended in the composition, the dynamic strength and dielectric breakdown strength of an organopolysiloxane cured product (hereinafter, simply referred to as a "cured product") obtained by curing the fluoroalkyl group-containing curable organopolysiloxane composition according to the present invention can be increased. The blending amount of these reinforcing inorganic fine particles is preferably within the range of 0.1 to 30 mass %, more preferably within the range of 0.1 to 10 mass %, with respect to the curable organopolysiloxane composition. If the blending amount is outside the abovementioned preferable range, the effects obtained by blending inorganic particles may not be obtained or the moldability of the curable organopolysiloxane composition may decrease.

A portion of or all inorganic fine particles (irrespective of the particle diameter, function, etc.) used in the curable organopolysiloxane composition according to the present invention may be surface treated with one or more surface treating agents. While not particularly limited thereto, examples of the type of surface treatment include hydrophilic treatment or hydrophobic treatment, with hydrophobic treatment preferable. Hydrophobically treated inorganic fine particles can be used so as to be dispersed at a high filling rate in the organopolysiloxane composition. Moreover, any increase in the viscosity of the composition is inhibited, improving moldability.

The surface treatment can be carried out by subjecting inorganic fine particles to treatment (or coating treatment) with the surface treating agent. As a hydrophobic surface treating agent, at least one surface treating agent selected from the group consisting of an organic titanium compound, organic silicon compound, organic zirconium compound, organic aluminum compound, and organic phosphorus compound is exemplified. One surface treating agent may be used independently or two or more thereof may be used in combination. Of these surface treating agents, an organic silicon compound (among others, silazane, silanes, siloxanes, and polysiloxanes) is preferably used, while silazane, alkyltrialkoxysilanes, and trialkoxysilylpolydimethylsiloxanes at one terminal are most preferably used.

The percentage of the surface treating agent with respect to the total amount of inorganic fine particles is preferably within the range of 0.1 mass % or more, 10 mass % or less, more preferably within the range of 0.3 mass % or more, 5 mass % or less. Note that the treatment amount is the feed ratio of inorganic particles to the surface treating agent, such that surplus treating agents after treatment are preferably removed.

Other Functional Fillers

Exemplary other functional fillers include dielectric inorganic fine particles, conductive inorganic fine particles, insulating inorganic fine particles, and thermally conductive inorganic fine particles. One or more selected from these microparticles can be used in the composition according to the present invention. Note that these inorganic fine particles simultaneously have two or more functions including functioning as a reinforcing filler.

Exemplary preferable dielectric inorganic fine particles include one or more inorganic fine particles selected from the group consisting of composite metal oxides, wherein a portion of barium and titanium sites (of titanium oxide, barium titanate, strontium titanate, lead zirconate titanate, and barium titanate) is substituted with a alkaline earth metal (such as calcium, strontium, yttrium, neodymium, samarium, and dysprosium), zirconium, or rare earth metals, with titanium oxide, barium titanate, zirconate titanate barium calcium, and strontium titanate more preferable, and with titanium oxide and barium titanate further preferable.

Specifically, at least a portion of the dielectric inorganic fine particles are particularly preferably dielectric inorganic fine particles, with a specific dielectric constant at room temperature at 1 kHz of 10 or more. Note that the upper limit of the preferable size (average primary particle diameter) of these inorganic fine particles is 20,000 nm (20 μm), more preferably 10,000 nm (10 μm), taking into consideration the processability into the below-mentioned thin film for a transducer. The use of these dielectric inorganic fine particles may further improve the mechanical properties and/or the electric properties of the organopolysiloxane cured product, specifically, the specific dielectric constant.

The conductive inorganic fine particles are not particularly limited as long as they can impart conductivity to the organopolysiloxane cured product. Specific examples thereof include: conductive carbons such as conductive carbon black, graphite, and vapor phase growth carbon (VGCF); and metal powders such as platinum, gold, silver, copper, nickel, tin, zinc, iron, and aluminum, and further includes: antimony-doped tin oxide, phosphorous-doped tin oxide, needle shaped titanium oxide the surface of which is coated with tin oxide/antimony, tin oxide, indium oxide, antimony oxide, zinc antimonate, and pigments obtained by coating tin oxide, etc. on the whisker surface of carbon and graphite; pigments obtained by coating at least one conductive metal oxide selected from the group consisting of tin-doped indium oxide (ITO), fluorine-doped tin oxide (FTO), phosphorous-doped tin oxide, and nickel oxide; pigments having conductivity containing tin oxide and phosphorus on the surface of titanium dioxide particles; etc., wherein these may be treated with the below-mentioned various surface treating agents. Each of these may be used independently or two or more thereof may be used in combination.

Further, the conductive inorganic fine particles may be obtained by coating conductive materials such as metals on the surface of fibers (such as glass fibers, silica alumina fibers, alumina fibers, and carbon fibers), needle shaped reinforcing materials (such as aluminum borate whisker and potassium titanate whisker), and inorganic fillers (such as glass beads, talc, mica, graphite, wollastonite, and dolomite).

The insulating inorganic fine particles which can be used in the present invention are not limited as long as they are generally known insulating inorganic materials, that is, particles of inorganic materials having a volume resistivity of $10^{10}$ to $10^{18}$ Ω·cm, wherein any shape such as a particle shape, flake shape, and fiber shape (including whiskers) can be used. Specific examples thereof include ceramic spherical particles, plate shaped particles, or fibers, with preferable use examples thereof including metal silicates (such as alumina, iron oxide, copper oxide, mica, and talc), as well as particles such as quartz, amorphous silica, and glass. Moreover, these may be treated with the below-mentioned various surface treating agents. Each of these may be used independently or two or more thereof may be used in combination. When the insulating inorganic fine particles are blended in the composition, the dynamic strength and dielectric breakdown strength of the organopolysiloxane cured product can be increased along with the specific dielectric constant.

The blending amount of these insulating inorganic particles is, in accordance with the application thereof, preferably within the range of 0.1 to 20 mass %, more preferably within the range of 0.1 to 5 mass %, with respect to the curable organopolysiloxane composition. If the blending amount is outside the abovementioned preferable range, the effects of blending may not be obtained or the dynamic strength of the organopolysiloxane cured product may decrease.

Exemplary thermally conductive inorganic fine particles which can be used in the present invention include: metal oxide particles such as magnesium oxide, zinc oxide, nickel oxide, vanadium oxide, copper oxide, iron oxide, and silver oxide; and inorganic compound particles such as aluminum nitride, boron nitride, silicon carbide, silicon nitride, boron carbide, titanium carbide, diamond, and diamond-like carbon, with zinc oxide, boron nitride, silicon carbide, and silicon nitride preferable. By blending one or more of these thermally conductive inorganic fine particles in the composition, the thermal conductivity of the organopolysiloxane cured product can be increased.

The average particle diameter of these inorganic particles can be measured by any measurement method normal in this field. For example, if the average particle diameter is 50 nm or more, approximately 500 nm or less, the particle diameter is measured by observation using a microscope such as a transmission type electron microscope (TEM), a field emission type transmission electron microscope (FE-TEM), a scanning type electron microscope (SEM), or a field emission type scanning electron microscope (FE-SEM), etc., so that the average value can be obtained to measure the average primary particle diameter. In contrast, if the average particle diameter is approximately 500 nm or more, the value of the average primary particle diameter can be directly obtained using a laser diffraction/scattering type particle size distribution measurement apparatus, etc.

Other Optional Components

The curable organopolysiloxane composition according to the present invention may contain an additive, an adhesive improver, etc. in order to further improve releasability or dielectric breakdown properties.

A film shaped or sheet shaped cured product obtained by curing the fluoroalkyl group-containing curable organopolysiloxane composition according to the present invention into a thin film shape can be suitably utilized for an electroactive film (dielectric layer or electrode layer) configuring a transducer. However, if the releasability of the cured layer is poor in forming a thin film, when a dielectric film is manufactured at a particularly high speed, the dielectric film may be broken upon releasing the mold. Moreover, as the dielectric layer used in the actuator, touch panel, etc., it may be necessary to reduce the adhesion in order to improve the sensitivity at low pressures. The fluoroalkyl group-containing curable organopolysiloxane composition according to the present invention can improve the manufacturing speed of the film without damaging the film, while the addition of other release agents can further reduce the adhesion.

Exemplary releasable improving additives (=release agents) applicable to the fluoroalkyl group-containing curable organopolysiloxane composition according to the present invention include a carboxylic acid based release agent, an ester based release agent, an ether based release agent, a ketone based release agent, an alcohol based release agent, etc. One of these may be used independently or two or more thereof may be used in combination. Moreover, exemplary release agents which can be used include release agents not containing silicon atoms, release agents containing silicon atoms, or a mixture of these release agents. Specific examples thereof are the same as Patent Document 1 (WO 2014-105959).

The dielectric breakdown properties improver is preferably an electric insulating improver and can be selected from the group consisting of a hydroxide or salt of aluminum or magnesium, clay mineral, and mixtures thereof, specifically, aluminum silicate, aluminum sulfate, aluminum hydroxide, magnesium hydroxide, fired clay, montmorillonite, hydrotalcite, talc, and mixtures thereof. Moreover, this insulating improver may be treated by a known surface treatment method. Specific examples thereof are the same as Patent Document 1 (WO 2014-105959).

The adhesive improver is configured to improve the adhesion to a substrate in which the fluoroalkyl group-containing curable organopolysiloxane composition according to the present invention is in contact during curing. If the dielectric layer serving as the cured product of this composition is not re-released, it is an effective additive. Exemplary adhesive improvers include: organic functional alkoxysilane compounds such as vinyltriethoxysilane, allyltrimethoxysilane, allyltriethoxysilane, 3-glycidoxypropyltrimethoxysilane, and 3-methacryloxypropyltrimethoxysilane; and siloxane derivatives thereof, specifically chain or three dimensional resinous siloxane derivatives substituted with a fluorine-containing organic group.

As long as other optional components do not impair the technical effects of the present invention, examples thereof include: antioxidants such as phenol based, quinone based, amine based, phosphorus based, a phosphite based, sulfur based, and thioether based antioxidants; light stabilizers such as triazole based and benzophenone based light stabilizers; flame retardants such as phosphoric ester based, halogen based, phosphorus based, and antimony based flame retardants; one or more antistatic agents including cation based surfactants, anion based surfactants, nonionic surfactants, etc.; dyes; pigments; etc.

Optional Solvents

While the fluoroalkyl group-containing curable organopolysiloxane composition according to the present invention can be directly subjected to the curing reaction, an organic solvent can be used as required in order to improve the miscibility and handleability, if this composition is in a solid state or a viscous liquid state. Specifically, if the fluoroalkyl group-containing curable organopolysiloxane composition according to the present invention is coated in a film shape, a solvent is preferably used to adjust the viscosity such that the overall viscosity is within the range of 100 to 10,000 mPa·s; wherein, if it is diluted with a solvent, it can be used within the range of 0 to 2000 parts by mass with respect to the sum of the abovementioned solid content (100 parts by mass). That is, in the present invention composition, the solvent may be 0 parts by mass. Specifically, because the fluoroalkyl group-containing curable organopolysiloxane composition according to the present invention selects a polymer having a low degree of polymerization, it can advantageously be a solvent-free design, a fluorine based solvent, an organic solvent, etc. and does not reside in the film obtained by curing, enabling the resolution of problems of environmental load and the influence of a solvent on electronic devices.

While not particularly limited thereto, as long as the type of organic solvent used herein is a compound which may dissolve all components in the composition or a portion of the components, a type having a boiling point of 80° C. or more and less than 200° C. is preferably used. Examples include i-propyl alcohols, t-butyl alcohols, cyclohexanols, cyclohexanones, methyl ethyl ketones, methyl isobutyl ketones, toluenes, xylenes, mesitylenes, 1,4-dioxanes, dibutyl ethers, anisoles, 4-methyl anisoles, ethyl benzenes, ethoxy benzenes, ethylene glycols, ethylene glycol dimethyl ethers, ethylene glycol diethyl ethers, 2-methoxy ethanols (ethylene glycol monomethyl ethers), diethylene glycol dimethyl ethers, diethylene glycol monomethyl ethers, 1-methoxy-2-propyl acetates, 1-ethoxy-2-propyl acetates, octamethyl cyclotetrasiloxanes, hexamethyl disiloxanes, and other non-halogen solvents, trifluoromethyl benzenes, 1,2-bis (trifluoromethyl) benzenes, 1,3-bis (trifluoromethyl) benzenes, 1,4-bis (trifluoromethyl) benzenes, trifluoromethyl chlorobenzenes, trifluoromethyl fluorobenzenes, hydrofluoroethers, and other halogen solvents. The organic solvent can be used independently or as a mixture of two or more types thereof. As the content of fluoroalkyl groups in the curable composition increases, the ratio of the abovementioned halogen based solvent used must be increased.

Overall Viscosity of the Composition

While not particularly limited thereto, the viscosity of the present composition at 25° C. can be adjusted to the viscosity within the range such that the present composition can be coated on the thin film, preferably within the range of 100 to 500,000 mPa·s, further preferably within the range of 300 to 50,000 mPa·s, particularly preferably within the range of 1,000 to 10,000 mPa·s. In order to set the preferable viscosity range, the amount of the abovementioned organic solvent used can be adjusted.

The fluoroalkyl group-containing curable organopolysiloxane composition according to the present invention can be prepared by uniformly mixing the abovementioned components (A) to (C), in addition to adding and uniformly mixing other optional component as required. Mixing at normal temperature may be carried out using various stirrers or kneaders; however, mixing under heating may be carried out if it is a combination of components which are not cured in mixing. Moreover, when it comes to mixing, an extruder or kneader (more specifically, one or more mechanical means selected from a biaxial extruder, biaxial kneader, and uniaxial blade type extruder) may be used for kneading and manufacturing. Specifically, in the present invention, the reactive organopolysiloxane component, a filler, and the surface treating agent may be kneaded using a biaxial extruder having a free volume of 5,000 (L/hour) or more to form a silicone gum compound (master batch) containing a high concentration of inorganic fine particles (for example, 80 mass % or more), after which other reactive organopolysiloxane components, curing catalysts, and other components may be added and knead to manufacture a curable organopolysiloxane composition.

If not cured during mixing, the blending order of each component is not particularly limited. If the components are not immediately used after mixing, they are preferably separated and stored in multiple containers such that components (B) and (C) are not present in the same container, after which, immediately prior to use, components in all containers are preferably mixed.

The curing reaction of the fluoroalkyl group-containing curable organopolysiloxane composition according to the present invention is normally achieved by heating this composition or exposing this composition to active energy rays. While not particularly limited thereto, the curing reaction temperature by heat is preferably 50° C. or higher 200° C. or lower, more preferably 60° C. or higher 200° C. or lower, further preferably 80° C. or higher 180° C. or lower. Moreover, the time for the curing reaction depends on the structure of the abovementioned (A), (B), and (C) components and is normally 1 second or more and 3 hours or less. Generally, it can be held within a range of 90 to 180° C. for 10 seconds to 30 minutes to obtain the cured product.

Exemplary active energy rays which may be used in the curing reaction include ultraviolet rays, electron rays, and radiation rays, etc., with ultraviolet rays preferable in terms of practicality. If the curing reaction is carried out using ultraviolet rays, a catalyst for a hydrosilylation reaction having high activity on the ultraviolet rays used, for example, a bis(2,4-pentanedionato)platinum complex or a (methylcyclopentadienyl)trimethylplatinum complex are preferably added. The ultraviolet ray generating source is suitably a high pressure mercury lamp, a medium pressure mercury lamp, an Xe—Hg lamp, a deep UV lamp, etc., with the irradiation amount in this case preferably being 100 to 8,000 mJ/cm$^2$.

The cured product according to the present invention is characteristically obtained by curing the abovementioned fluoroalkyl group-containing curable organopolysiloxane composition. The shape of the cured product is not particularly limited, with examples thereof including a sheet shape, a film shape, and a tape shape. Specifically, the abovementioned fluoroalkyl group-containing curable organopolysiloxane composition has a high curing speed, along with good processability for manufacturing a molded product such as a film, such that a cured product having the desired thickness and shape can be efficiently produced.

[Members]

The abovementioned cured product is a gel or elastomer having excellent electric properties and mechanical properties, in addition to having a high specific dielectric constant and mechanical strength (specifically, tensile strength, tear strength, elongation percentage, etc.) Consequently, an electroactive silicone elastomer sheet or electroactive silicone gel sheet obtained by curing this organopolysiloxane composition into a thin film shape can be used as electronic materials, display apparatus members, or transducer members (including members for sensors, speakers, actuators, and generators) and can be particularly suitably utilized as an electroactive film (dielectric layer or electrode layer) configuring the transducer.

Mechanical Strength

If the organopolysiloxane cured product obtained by at least partially curing the curable organopolysiloxane composition according to the present invention is heated and molded into a sheet having a thickness of 2.0 mm, it can be designed to have the following dynamic properties measured based on JIS K 6249.

(1) The Young's modulus (MPa) at room temperature can be 10 MPa or less, particularly suitably within the range of 0.1 to 2.5 MPa.

(2) The tear strength (N/mm) at room temperature can be 1 N/mm or higher, particularly suitably within the range of 2 N/mm or higher.

(3) The tensile strength (MPa) at room temperature can be 1 MPa or more, particularly suitably within the range of 2 MPa or more.

(4) The elongation at break (%) can be 200% or more, particularly suitably within the range of 200 to 1000% in terms of the displacement amount of the transducer.

Dielectric Properties

The organopolysiloxane cured product (elastomer or gel) obtained by curing the curable organopolysiloxane composition according to the present invention can be designed to have the following dielectric properties.

(1) When heated and molded into a shape having a thickness of 0.10 mm, the dielectric breakdown strength (V/µm) can be 20 V/µm or more. The suitable dielectric breakdown strength changes in accordance with the application of the transducer and is particularly suitably within the range of 30 V/µm or more.

(2) When heated and molded into a shape having a thickness of 1 mm, the specific dielectric constant measured under the conditions of a measurement temperature of 25° C. and a measuring frequency of 100 KHz can be 3.0 or more. While the suitable specific dielectric constant changes in accordance with the type of transducer and the form of the required dielectric layer, it is particularly suitably within the range of 5.0 or more under the abovementioned measurement conditions.

The organopolysiloxane cured product obtained by curing or semicuring the curable organopolysiloxane composition according to the present invention can be particularly suitably used as a transducer member selected from artificial muscles, an actuator, a sensor, and a power generation element, in terms of the dielectric properties and dynamic properties thereof. Specifically, the curable organopolysiloxane composition is generally molded into a sheet shape or film shape, then cured by heating or irradiation with high energy rays, etc. While not particularly limited thereto, exemplary methods for molding the curable organopolysiloxane composition into a film shape may include: a method for applying the curable organopolysiloxane composition on a substrate via a conventionally known application method to form a coating film; a molding method via an extruder provided in a predetermined shaped slot; etc.

The thickness of such a film shaped curable organopolysiloxane composition can be, for example, within the range of 0.1 μm to 5,000 μm. The thickness of the obtained cured product may be thinner than the thickness of the applied composition depending on the application method and the presence of a volatile solvent.

Further, the film or sheet of the organopolysiloxane cured product is preferably substantially flat. Specifically, such a organopolysiloxane cured product may be a high dielectric film of a fluoroalkyl group-containing organopolysiloxane cured product, wherein, in the width direction of the film, the difference between the terminal thickness and the central thickness is within 5.0%, while the film center thickness is within the range of 50 to 1000 μm. The film or sheet of such a organopolysiloxane cured product, as well as the manufacturing technique thereof, which has been as proposed in the international patent application (PCT/JP2017/15028) by the present applicants, can also be applied to the organopolysiloxane cured product according to the present invention. A substantially flat transducer member of any thickness can be designed by laminating multiple films or sheets of such a flat organopolysiloxane cured product by the below-mentioned method.

Note that after manufacturing a film shaped curable organopolysiloxane composition via the abovementioned method, while a magnetic field or electric field is optionally applied to this film shaped curable organopolysiloxane composition in the orientation direction of the object dielectric inorganic fine particles or a magnetic field or electric field is optionally applied for a fixed period of time so as to orient a filler, the curable organopolysiloxane composition may then be cured by heat curing, curing at normal temperature, or curing by irradiation with high energy rays. While each curing or curing condition is not particularly limited, if the curable organopolysiloxane composition is an addition curable organopolysiloxane composition, it can be held within the range of 90° C. to 180° C. for 30 seconds to 30 minutes.

If a cured layer obtained by curing the fluoroalkyl group-containing curable organopolysiloxane composition according to the present invention is a dielectric layer, particularly a dielectric film member for a transducer such as an actuator, the cured layer is preferably treated as a laminate film that is peelably disposed on a film substrate provided with a release layer capable of releasing a coating.

While not particularly limited thereto, the thickness of the organopolysiloxane cured product serving as a transducer member is, for example, 1 to 2,000 μm. Here, one layer or two or more layers of the organopolysiloxane cured product according to the present invention is/are laminated; moreover, it may be further configured such that an electrode layer is provided on both ends of the dielectric layer, while the transducer itself including the electrode layer and the dielectric layer is highly laminated. In this case, while the thickness of the organopolysiloxane cured product per one layer is 0.1 μm to 1,000 μm, the thickness may be 0.2 to 2,000 μm by laminating two or more layers of this organopolysiloxane cured product.

While not particularly limited thereto, a method for forming the laminated organopolysiloxane cured layer can be carried out by: (1) a method involving applying the curable organopolysiloxane composition onto the substrate, curing the composition to obtain an organopolysiloxane cured product layer, then further applying the curable organopolysiloxane composition onto the same cured layer, and sequentially repeating curing and application for lamination; (2) a method involving applying the curable organopolysiloxane composition onto the substrate in an uncured or semicured state in a layering manner, then curing the overall different layered coated curable organopolysiloxane composition; and (3) a method involving applying the curable organopolysiloxane composition onto the substrate having a release layer, curing the composition to obtain an organopolysiloxane cured product layer, then separating this cured layer from a release layer, and physically laminating the cured product on a separately similarly prepared organopolysiloxane cured product layer; or (4) combinations of these methods.

In the invention according to the present application, for example, the curable organopolysiloxane composition can be applied to a substrate by die coating to be cured, two or more laminated silicone elastomer cured layers can be formed and the obtained silicone elastomer cured layer can be further adhered to an electrode to be manufactured. In this case, the two or more laminated silicone elastomer cured layers are preferably dielectric layers, while the electrode is preferably a conductive layer.

Die coating is an application system which can realize high speed application and has high productivity. The transducer according to the present invention having a multilayer structure may be manufactured by applying one layer including the organopolysiloxane composition as a single layer, in addition to applying a layer including another organopolysiloxane composition. Moreover, the transducer can be manufactured by simultaneously layering and applying a layer including each organopolysiloxane composition.

An organopolysiloxane cured product serving as a transducer member can be obtained by coating the curable organopolysiloxane composition on a substrate, in addition to curing it at room temperature, under heating or under irradiation with high energy rays such as ultraviolet rays. Moreover, if a thin film shaped dielectric silicone elastomer is layered, an uncured curable organopolysiloxane composition may be coated and sequentially cured on the cured layer or an uncured curable organopolysiloxane composition may be layered and simultaneously cured.

The abovementioned thin film shaped organopolysiloxane cured product is particularly useful as the dielectric layer of the transducer, wherein the transducer can be formed by providing the electrode layer on both ends thereof. Note that conductive inorganic particles may be blended in the curable organopolysiloxane composition according to the present invention so as to impart a function as the electrode layer. Note that in the specification of the present invention, the "electrode layer" may be simply referred to as an "electrode."

One form of the abovementioned transducer member is a thin film that is sheet or film shaped. The film thickness is generally 1 µm to 2,000 µm and includes structures of a single layer, two layers or more, or many more layers laminated. Moreover, if electroactive organopolysiloxane cured product layers which are laminated as required are used as the dielectric layers, they may be 5 µm to 10,000 µm, or a further layered film thickness thereof can be used.

A thin film shaped organopolysiloxane cured product layer serving as this transducer member may be obtained by layering the same thin film shaped silicone elastomer or by layering a thin film shaped silicone elastomer having two or more different physical properties or having different compositions prior to curing. Moreover, the function of the thin film shaped organopolysiloxane cured product layer may be as a dielectric layer or an electrode layer. Specifically, a transducer member which has a thickness of the dielectric layer of 1 to 1,000 µm in addition to having an electrode layer thickness of 0.05 µm to 100 µm is preferably exemplified.

The transducer according to the present invention characteristically has this transducer member obtained by curing the curable organopolysiloxane composition according to the present invention and may specifically have a high lamination structure, that is, a structure including two or more dielectric layers. Further, it may have a structure including three or more dielectric layers. If the transducer having such a high lamination structure includes multiple layers, it can generate greater force. Moreover, a larger displacement can be obtained by lamination than a single layer.

An electrode can be included on both ends of the dielectric layer of the transducer according to the present invention. Examples of the electrode material which can be used include: metals and alloys thereof such as gold, platinum, silver, palladium, copper, nickel, aluminum, titanium, zinc, zirconium, iron, cobalt, tin, lead, indium, chromium, molybdenum, and manganese; metal oxides such as indium-tin composite oxide (ITO), antimony-tin composite oxide (ATO), ruthenium oxide, titanium oxide, zinc oxide, and tin oxide; carbon materials such as carbon nanotubes, carbon nanohorns, carbon nanosheets, carbon fibers, and carbon black; and conductive resins such as poly(ethylene-3,4-dioxythiophene)(PEDOT), polyaniline, and polypyrrole. Conductive resins and elastomers with a conductive filler dispersed in resin may be used.

The electrode may include one of the abovementioned conductive materials independently or two or more thereof. If the electrode includes two or more conductive materials, at least one type is made to function as an active material, in addition to functioning as a conductive material for reducing the resistance of the remaining electrode.

The total thickness of the dielectric layer of the transducer according to the present invention can be within the range of 10 µm to 2,000 µm (2 mm), specifically 200 µm or more. Specifically, the thickness per one layer of a dielectric silicone elastomer forming the dielectric layer is preferably a thickness of 0.1 to 500 µm, particularly preferably 0.1 to 200 µm. When two or more layers of these silicone elastomer layers are laminated, properties such as the dielectric breakdown voltage, dielectric constant, and displacement amount can be improved compared with a single layer.

The transducer in the present invention refers to an element, equipment, or apparatus for converting a certain type of energy to another energy, with examples thereof including: artificial muscles and actuators for converting electric energy to mechanical energy; sensors and power generation elements for converting mechanical energy to electric energy; and speakers, microphones, and headphones for converting electric energy to acoustic energy.

The transducer according to the present invention can be specifically used as the artificial muscles, actuator, sensor, and power generation element in terms of the dielectric and mechanical properties. The application of artificial muscles is anticipated in robots, nursing equipment, rehabilitation equipment, etc. The embodiments of the actuator will hereinafter be described.

FIG. 1 illustrates a cross sectional view of an actuator 1 according to the present embodiment when a dielectric layer is laminated. In the present embodiment, the dielectric layer may be two layers as an example. An actuator 1 includes dielectric layers 10a and 10b, electrode layers 11a and 11b, a wiring 12, and a power source 13. Each of the electrode layers 11a and 11b covers one face of the respectively contacting dielectric layers and is connected to the power source 13 via the wiring 12.

The actuator 1 can be driven by applying a voltage between the electrode layer 11a and the electrode layer 11b. By applying voltage, the thickness of the dielectric layers 10a and 10b decreases due to the dielectricity thereof, such that the dielectric layers 10a and 10b extend in parallel to the faces of the electrode layers 11a and 11b. That is, electric energy force can be converted to mechanical energy of force, variation, or displacement.

FIG. 2 illustrates a cross sectional view of an actuator 2 according to the present embodiment when a dielectric layer and an electrode layer are laminated. In the present embodiment, three dielectric layers and four electrode layers are used. An actuator 2 includes dielectric layers 20a, 20b and 20c, electrode layers 21a, 21b, 21c and 21d, a wiring 22, and a power source 23. Each of the electrode layers 21a, 21b, 21c and 21d covers one face of the respectively contacting dielectric layers and is connected to the power source 23 via the wiring 22. The electrode layers are connected to sides having alternately different voltages, wherein the electrode layers 21a and 21c and the electrode layers 21b and 21d are connected to respectively different sides.

The actuator 2 can be driven by applying a voltage between the electrode layer 21a and the electrode layer 21b, between the electrode layer 21b and the electrode layer 21c, and between the electrode layer 21c and the electrode layer 21d. By applying voltage, the thickness of the dielectric layers 20a, 20b, and 20c decreases due to the dielectricity thereof, such that the dielectric layers extend in parallel to the faces of the electrode layers 21a, 21b, 21c, and 21d. That is, electric energy force can be converted to mechanical energy of force, variation, or displacement.

The embodiments of the actuator as one example of the transducer according to the present invention are as mentioned above. In addition, if mechanical energy such as a pressure is applied from the outside to the transducer according to the present invention, the capacitance between the electrode layers changes along with the deformation of the dielectric layers, enabling the use thereof as a sensor for reading this change. The embodiments of this sensor will hereinafter be described.

FIG. 3 illustrates a view illustrating the configuration of a sensor 3 according to the present embodiment. A sensor 3 has a structure in which a dielectric layer 30 is disposed between the upper electrode layers 31a, 31b and 31c and the lower electrode layers 32a, 32b and 32c which are disposed in a matrix shape. The present embodiment is configured such that the electrode layers are disposed atop three rows of a matrix in the longitudinal direction and in the transverse direction. Each electrode layer can protect the face (not contacting the dielectric layer 30) with an insulating layer. Moreover, the dielectric layer 30 includes two or more layers of the same dielectric layer including an organopolysiloxane.

When external force is applied to the surface of the sensor 3, the thickness of the dielectric layer 30 between the upper electrode layers and the lower electrode layers in the applied region changes, while the capacitance between the electrode layers changes along with this change. For example, the external force can be detected by measuring changes in the voltage caused by changes in the capacitance between these electrode layers.

Note that in the sensor 3 according to the present embodiment, three pairs of electrode layers which face each other via the dielectric layer are formed, wherein the number, size, and arrangement, etc. of the electrode layers can be appropriately determined in accordance with the application.

The power generation element is a transducer for converting mechanical energy to electric energy and can be applied to apparatuses for generating power using vibration, impact, and pressure changes, with the power generation including wave power, water power, and natural energy such as water power. The embodiments of this power generation element will hereinafter be described.

FIG. 4 illustrates a cross sectional view of a power generation element 4 according to the present embodiment when a dielectric layer is laminated. In the present embodiment, the dielectric layer may be two layers as an example. A power generation element 4 includes dielectric layers 40a and 40b, along with electrode layers 41a and 41b, wherein the electrode layers 41a and 41b cover one face of respectively contacting dielectric layers.

The electrode layers 41a 41b are electrically connected to a load (not illustrated), the present power generation element 4 changes the distance between the electrode layers 41a 41b, thereby changing the capacitance to generate electric energy. That is, the element shape is changed such that the electrode layers 41a 41b are electrostatically induced by an electrostatic field (formed by the dielectric layers 40a and 40b) so as to generate power.

In the present embodiment, when the state changes from a state (upper figure) in which compression force is applied in the direction parallel to the faces of the electrode layers 41a and 41b of the power generation element 4 illustrated in FIG. 4 to a state (lower figure) in which the compression force illustrated in the figure is not applied, for example, the capacitance between the electrode layers 41a 41b can change so as to convert mechanical energy to electric energy. Moreover, a power generation apparatus can be configured such that multiple elements are disposed on a substrate and connected in series or in parallel to improve the power generation amount.

The transducer according to the present invention can operate in air, water, vacuum, and an organic solvent. Moreover, sealing treatment may be appropriately carried out in accordance with the usage environment. While not particularly limited thereto, examples thereof include the sealing method with a resin material, etc.

INDUSTRIAL APPLICABILITY

The fluoroalkyl group-containing curable organopolysiloxane composition according to the present invention, as well as a cured product obtained by curing the composition, can be suitably used for applications in which an elastomer or gelled member having excellent dynamic properties and electric properties is required, for example, the manufacture of a transducer. The curable organopolysiloxane composition according to the present invention partially reacts with an uncured curable composition, as well as reactive organopolysiloxane, but includes a so-called B stage material not reaching curing in the state during curing. Exemplary B stage materials according to the present invention include those in a state of gelation or fluidity. Therefore, the aspects of the present invention include a transducer member in a state of gelation or fluidity in the state in which the curing reaction of the curable organopolysiloxane composition partially proceeds. Moreover, such a semicured transducer member may have a structure in which the thin film shaped organopolysiloxane cured product is used as one layer or laminated.

Specifically, the abovementioned cured product is a gel or elastomer having excellent electric properties and mechanical properties, in addition to having a high specific dielectric constant and mechanical strength (specifically, tensile strength, tear strength, elongation percentage, etc.). Consequently, an electroactive silicone elastomer sheet or electroactive silicone gel sheet obtained by curing this organopolysiloxane composition into a thin film shape can be suitably utilized for an electroactive film (dielectric layer or electrode layer) configuring the transducer. For example, they are useful as transducer materials proposed by the present applicants in Patent Document 1 or 2. In addition, they can be applied to transducer apparatuses using dielectric elastomers other than silicone without particular limitations, wherein a portion or all of a dielectric elastomer layer can be designed in place of the abovementioned cured product. A large number of structures of such a transducer (including the actuator) have been proposed, with examples thereof as International Patent Publications including WO2011/118315, with examples thereof as Japanese Unexamined Patent Application Publications including JP 2008-533973 W, JP 2001-524278 W, JP 2008-187079 A, JP 2008-277729 A, JP 2009-59856 A, JP 2009-219302 A, JP 2012-65427 A, JP 2016-226258 A, JP 2017-064836 A, etc. Note that the structural design or design changes associated with the substitution of a portion or all of the dielectric elastomer layer with the abovementioned cured product can be responded to via normal creation by those skilled in the art, with the present invention strongly suggesting such creation.

Similarly, the abovementioned cured product can be utilized in place of an electrolyte layer or dielectric layer in an actuator element structure known as a so-called "polymer actuator" or "polymer actuator." Specifically, a portion or all of an electrolyte layer can be substituted and utilized in a polymer actuator which has: the electrolyte layer (including an electrolyte layer in which an ionic liquid is contained in a polymer); and an electrode layer formed in the electrolyte layer, and deforms in accordance with the voltage applied to the electrolyte layer. Note that a large number of structures of such a polymer actuator have been proposed, with examples thereof as International Patent Publications including WO 10/100907, WO 10/110417, WO 11/114965, WO 10/029992, WO 13/118628, and WO 14/104331, with examples thereof as Japanese Unexamined Patent Application Publications including JP 2004-282992 A, JP 2008-251697 A, JP 2010-003553 A, JP 2012-055153 A, JP 2013-255397 A, JP 2013-106491 A, JP 2013-251942 A, JP 2015-126597 A, JP 2015-186301 A, JP 2016-189651 A, etc. Note that organopolysiloxane cured products according to the present invention can be designed in the desired shape in an elastomer or gel unlike electrolytes and are useful for structure designs particularly requiring lamination or a high displacement amount. Therefore, in the existing polymer actuator, structure designs or design changes which reflect the abovementioned mechanical properties and dielectric properties can be responded to via normal creation by those skilled in the art, with the present invention strongly suggesting such creation.

Other applications of the fluoroalkyl group-containing curable organopolysiloxane composition and a cured product obtained by curing the same according to the present invention are in no way limited to the disclosure above, with a dielectric layer film provided with a cured product obtained by curing the fluoroalkyl group-containing curable organopolysiloxane composition according to the present invention capable of being used in various flat panel displays (FPDs) for displaying characters, symbols, and images such as television receivers, computer monitors, monitors for personal digital assistants, surveillance monitors, video cameras, digital cameras, mobile phones, personal digital assistants, displays for instrument panels of automobiles or the like, displays for instrument panels of various equipment, devices, and instruments, automatic ticket machines, and automated teller machines. As a device, the present invention can be applied to display devices such as CRT displays, liquid crystal displays, plasma displays, organic EL displays, inorganic EL displays, LED displays, surface electrolytic displays (SEDs), and field emitting displays (FEDs), or touch panels utilizing the same. The film according to the present invention may be used for the purpose of scratch prevention, stain prevention, fingerprint adhesion prevention, static prevention, glare prevention, peep prevention, and the like of these display surfaces.

EXAMPLES

Hereinafter, the present invention will be described by way of examples; however, the present invention is not limited thereto. The following compounds were used in the examples shown below.

Hereinafter, the present invention will be described by way of examples; however, the present invention is not limited thereto. The following compounds were used in the examples shown below.

Component (a1): a 3,3,3-trifluoropropylmethylsiloxane polymer blocked with a vinyldimethylsiloxy group at both terminals (siloxane degree of polymerization including terminals: approximately 268)

Component (a2): a 3,3,3-trifluoropropylmethylsiloxane polymer blocked with a vinyldimethylsiloxy group at both terminals (siloxane degree of polymerization including terminals: approximately 33)

Component (B1-1): bis(dimethylhydrogen siloxy)diphenylsilane

Component (B1-2): a diphenylsiloxane polymer blocked with a dimethylhydrogen siloxy group at both terminals (siloxane degree of polymerization: approximately 2.5)

Component (B1-3): tetramethyldihydrodisiloxane

Component (B2-1): siloxane (Mw=1.11×10$^3$, silicon atom-bonded hydrogen atoms are approximately 0.59 wt %) made up of dimethylhydrosiloxy units ($M^H$ units) and $T^{F3Pr}$ units (trifunctional siloxy units) having a 3,3,3-trifluoropropyl group Note that the weight average molecular weight (Mw) of component (B2-1) is the weight average molecular weight in terms of polystyrene measured by GPC (gel permeation chromatography) using a tetrahydrofuran (THF) solvent.

Component (B2-2): a 3,3,3-trifluoropropylmethylmethylhydrosiloxane copolymer blocked with a trimethylsiloxy group at both terminals (siloxane degree of polymerization including terminals: approximately 12)

Note that silicon atom-bonded hydrogen atoms of component (B2-2) are approximately 0.53 wt %.

Component (C1): a dimethylsiloxane polymer solution blocked with a vinyldimethylsiloxy group at both terminals of a platinum-1,3-divinyl 1,1,3,3-tetramethyldisiloxane complex (at a platinum concentration of approximately 0.6 wt %)

<Hydrosilylation Reaction Inhibitor>

Component (D1): 1,3,5,7-tetramethyl-1,3,5,7-tetravinylcyclotetrasiloxane

<Filler>

Component (E1): surface treated CAB-O-SIL®MS75D

The compositions of the examples are indicated in Tables 1 and 2. Silicon atom-bonded hydrogen atoms (Si—H) of components (B1) and (B2) per one mol of vinyl groups in the composition were used in an amount of 1.3 mol in the following examples. Moreover, the ratio of Si—H of (B1) to (B2) is indicated as $B1_H/B2_H$. Further, the degree of polymerization of component (A) was calculated using the following formula.

[NAA1/(NAA1+NAA2)]DPA1+[NAA2/(NAA1+NAA2)]DPA2

Here, NAA1 and NAA2 are obtained by dividing the weight ratios of (A1) and (A2) in component (A) by the number average molecular weight, wherein DPA1 and DPA2 respectively represent the degree of polymerization of (A1) and (A2).

Measurement of the Physical Properties of the Obtained Material

A silicone composition was press cured at 150° C. for 15 minutes, then further post cured at 150° C. for 60 minutes to 120 minutes in an oven to obtain a cured product. The tear strength of the obtained cured product was measured based on JIS-K6249, while the tensile strength and the elongation at break were measured to obtain the Young's modulus (modulus). Note that in order to measure mechanical strength, the thickness of the sheet was set to 2 mm. Moreover, the durometer A hardness of a sheet having a thickness of 6 mm was measured. However, it was unmeasurable if the cured product was too flexible.

Moreover, a sheet having a thickness of approximately 0.1 mm was manufactured under the abovementioned conditions to measure the dielectric breakdown strength using an electric insulating oil breaking voltage test apparatus of PORTATEST 100A-2 produced by Soken Electric Co., Ltd. Similarly, a sheet having a thickness of 1 mm was manufactured, after which the specific dielectric constant was measured at a temperature of 25° C. at a frequency within the range of 20 Hz to 1 MHz with an LCR meter of 6530P/D2 produced by Wayne Kerr. Values at 100 KHz among these were used for the examples and comparative examples. Various physical property values are indicated in Tables 1 to 3.

Comparative Examples 1 to 4

Using components other than (B1), the curable organopolysiloxane composition was manufactured in the composition indicated in Table 3 as in the examples to make the abovementioned various measurements.

TABLE 1

| Example No. | 1 | 2 | 3 | 4 | 5 | 6 |
|---|---|---|---|---|---|---|
| Component (a1) | 82.989 | 82.995 | 82.998 | 83.001 | 82.759 | 82.472 |
| Component (a2) | | | | | | |
| Component (B1-1) | 0.442 | 0.881 | 1.056 | 1.230 | | |
| Component (B1-2) | | | | | 0.500 | 1.143 |
| Component (B1-3) | | | | | | |
| Component (B2-1) | 1.327 | 0.881 | 0.704 | 0.527 | 1.499 | 1.143 |
| Component (B2-2) | | | | | | |
| Component (C1) | 0.133 | 0.133 | 0.133 | 0.133 | 0.133 | 0.133 |
| Component (D1) | 0.109 | 0.109 | 0.109 | 0.109 | 0.109 | 0.109 |
| Component (E1) | 15.00 | 15.00 | 15.00 | 15.00 | 15.00 | 15.00 |
| $B1_H/B2_H$ | 0.3 | 1.0 | 1.5 | 2.4 | 0.2 | 0.5 |
| Component (A) Average degree of polymerization | 266 | 266 | 266 | 266 | 266 | 266 |
| Young's modulus (MPa) | 0.83 | 0.66 | 0.47 | 0.27 | 0.91 | 0.76 |
| Tensile strength (MPa) | 5.0 | 4.2 | 3.7 | 2.1 | 4.1 | 5.5 |
| Elongation at break (%) | 378 | 486 | 523 | 558 | 310 | 399 |
| Tear strength (N/mm) | 5.0 | 5.4 | 5.4 | 4.7 | 4.6 | 5.1 |
| Hardness | 32 | 24 | 21 | 16 | 35 | 29 |
| Dielectric breakdown strength (V/μm) | 50 | 38 | 37 | 30 | 53 | 46 |
| Specific dielectric constant | 6.5 | 6.6 | 5.9 | 5.9 | 6.6 | 6.5 |

TABLE 2

| | Example No. | | | | |
|---|---|---|---|---|---|
| | 7 | 8 | 9 | 10 | 11 |
| Component (a1) | 83.521 | 61.087 | 61.093 | 82.947 | 82.893 |
| Component (a2) | | 20.362 | 20.364 | | |
| Component (B1-1) | | 2.150 | 2.641 | 0.881 | 0.881 |
| Component (B1-2) | | | | | |
| Component (B1-3) | 0.353 | | | | |
| Component (B2-1) | 0.884 | 1.158 | 0.660 | 0.465 | |
| Component (B2-2) | | | | 0.465 | 0.984 |
| Component (C1) | 0.133 | 0.133 | 0.067 | 0.133 | 0.133 |
| Component (D1) | 0.109 | 0.109 | 0.109 | 0.109 | 0.109 |
| Component (E1) | 15.00 | 15.00 | 15.00 | 15.00 | 15.00 |
| $B1_H/B2_H$ | 1.0 | 1.9 | 4.1 | 1.0 | 1.0 |
| Component (A) Average degree of polymerization | 266 | 95 | 95 | 266 | 266 |
| Young's modulus (MPa) | 0.57 | 0.69 | 0.18 | 0.52 | 0.29 |
| Tensile strength (MPa) | 3.4 | 3.1 | 0.5 | 1.9 | 1.7 |
| Elongation at break (%) | 375 | 315 | 301 | 489 | 387 |
| Tear strength (N/mm) | 4.4 | 4.3 | 2.3 | 4.5 | 3.8 |
| Hardness | 25 | 24 | Unmeasurable | 20 | 18 |
| Dielectric breakdown strength (V/μm) | 44 | 45 | 32 | 36 | 36 |
| Specific dielectric constant | 6.4 | 5.9 | 5.6 | 6.5 | 6.1 |

TABLE 3

| | Comparative Example No. | | | |
|---|---|---|---|---|
| | 1 | 2 | 3 | 4 |
| Component (a1) | 93.242 | 88.107 | 82.982 | 83.006 |
| Component (a2) | | | | |
| Component (B1-1) | | | | 1.577 |
| Component (B1-2) | | | | |
| Component (B1-3) | | | | |
| Component (B2-1) | 1.518 | 1.650 | 1.776 | 0.175 |
| Component (C1) | 0.133 | 0.133 | 0.133 | 0.133 |
| Component (D1) | 0.109 | 0.109 | 0.109 | 0.109 |
| Component (E1) | 5.00 | 10.00 | 15.00 | 15.00 |
| $B1_H/B2_H$ | 0 | 0 | 0 | 9.1 |
| Component (A) Average degree of polymerization | 266 | 266 | 266 | 266 |
| Young's modulus (MPa) | 0.50 | 0.67 | 1.1 | Unmeasurable |
| Tensile strength (MPa) | 0.8 | 2.1 | 4.3 | Unmeasurable |
| Elongation at break (%) | 214 | 244 | 277 | Unmeasurable |
| Tear strength (N/mm) | 1.9 | 2.7 | 4.1 | Unmeasurable |
| Hardness | 23 | 30 | 36 | Unmeasurable |
| Dielectric breakdown strength (V/μm) | 37 | 43 | 49 | Unmeasurable |
| Specific dielectric constant | 6.7 | 6.6 | 6.2 | — |

As mentioned above, in Examples 1 to 11, when components (B1) and (B2) are used in combination at a specific ratio, a variety of film shaped cured products (from a gel shape to an elastomer shape) having different hardnesses, etc. can be formed to obtain cured products having high electric properties. Further, it is indicated that the elongation at cutting of these cured products exceeds 300%, allowing a fluoroalkyl group-containing curable organopolysiloxane composition which yields cured products having excellent mechanical properties (specifically, elasticity) to be designed. In contrast, if component (B1) is not used or component (B1) is excessively used, as indicated in Comparative Examples 1 to 4, a fluoroalkyl group-containing curable organopolysiloxane composition which yields practical cured products cannot be obtained. Specifically, as indicated in Comparative Example 4, if component (B2) according to the present invention is excessively used, because the crosslinking reaction does not sufficiently proceed, cured products which can measure mechanical properties, etc. cannot be obtained.

Cured products obtained using such a fluoroalkyl group-containing curable organopolysiloxane composition according to one example of the present invention can be designed to have high electric properties, as well as a variety of hardness/Young's modulus as required, and have significantly excellent mechanical properties such as elasticity, allowing them to be widely utilized for applications of various transducers including actuators.

REFERENCE NUMERALS 1, 2 Actuator
10a, 10b, 20a, 20b, 20c Dielectric layer
11a, 11b, 21a, 21b, 21c, 21d Electrode layer (conductive layer)
12, 22 Wiring
13, 23 Power supply
3 Sensor
30 Dielectric layer
31a, 31b, 31c Upper electrode layer
32a, 32b, 32c Lower electrode layer
4 Power generation element
40a, 40b Dielectric layer
41a, 41b Electrode layer

What is claimed is:

1. A fluoroalkyl group-containing curable organopolysiloxane composition, the composition comprising:
(A) one or two or more fluoroalkyl group-containing organopolysiloxanes which have at least two alkenyl groups having a carbon number of 2 to 12 per molecule, wherein 10 mol % or more of all substituent groups on silicon atoms are fluoroalkyl groups represented by $(C_pF_{2p+1})$—R— where R is an alkylene group having a carbon atom number of 1 to 10, while p is an integer of 1 or more and 8 or less and the average degree of polymerization is 50 to 300 in an amount of 20 to 99 mass % relative to the sum of the mass of components (A), (B) and (C);
(B) an organohydrogen polysiloxane having the following components (B1) and (B2), wherein the ratio of the number of silicon atom-bonded hydrogen atoms in component (B1) based on an amount of component (B1) utilized to the number of silicon atom-bonded hydrogen atoms in component (B2) based on an amount of component (B2) utilized is within the range of 10:90 to 85:15;
(B1) linear organohydrogen polysiloxane having the average molecular formula $HR^2{}_2Si(OSiHR^2)_{e3}(OSiR^2{}_2)_{e4}OSiR^2{}_2H$ wherein $R^2$ independently any one of an alkyl group having 1 to 12 carbon atoms, an aryl group having 6 to 20 carbon atoms, an aralkyl group having 7 to 20 carbon atoms, a hydroxyl group, or an alkoxy group having 1 to 6 carbon atoms, e3 and e4 are each 0 or a positive number and e3+e4=0~10 and not having a fluoroalkyl group; and
(B2) one or more fluoroalkyl group-containing organohydrogen polysiloxanes selected from a linear organohydrogen polysiloxane represented by the following average unit formula (III) and a branched organohydrogen polysiloxane represented by the following average unit formula (IV):

$R^0{}_3Si(OSiR^4R^0)_{f1}(OSiR^0{}_2)_{f2}OSiR^0{}_3$ (III)

wherein $R^4$ is a fluoroalkyl group represented by $(C_pF_{2p+1})$—R— where R and p are as described above, $R^0$ is identically or independently an alkyl group having a carbon number of 1 to 12, an aryl group having a carbon number of 6 to 20, an aralkyl group having a carbon number of 7 to 20, a hydroxyl group, an alkoxy group having a carbon number of 1 to 6, or a silicon atom-bonded hydrogen atom, at least two of all $R^0$s are silicon atom-bonded hydrogen atoms, and f1 is a positive number, while f2 is 0 or a positive number, with each number satisfying 5<f1+f2<150;

$(HR^6{}_2SiO_{1/2})_{f3}(R^6{}_3SiO_{1/2})_{f4}(HR^6SiO_{2/2})_{f5}(R^6{}_2SiO_{2/2})_{f6}(R^5SiO_{3/2})_{f7}(SiO_{4/2})_{f8}$ (IV)

wherein $R^5$ is a fluoroalkyl group represented by $(C_pF_{2p+1})$—R— where R and p are as described above, $R^6$ is identically or independently an alkyl group having a carbon number of 1 to 12, an aryl group having a carbon number of 6 to 20, an aralkyl group having a carbon number of 7 to 20, a hydroxyl group, an alkoxy group having a carbon number of 1 to 6, or the fluoroalkyl group, f3 and f7 are positive numbers, f4, f5, f6, and f8 are 0 or positive numbers, and f3+f4+f5+f6+f7+f8 is a number in which the weight average molecular weight of an organohydrogen polysiloxane represented by formula (IV) is within the range of 400 to 10000;
wherein the sum of silicon atom-bonded hydrogen atoms in component (B) is an amount of 0.1 to 2.5 mol with respect to the total amount of one mol of an alkenyl group in a composition; and
(C) an effective amount of a hydrosilylation reaction catalyst.

2. The fluoroalkyl group-containing curable organopolysiloxane composition according to claim 1, wherein component (A) is an organopolysiloxane represented by the following average unit formula (I):

$R^1R^2{}_2Si(OSiR^1R^2)_{e1}(OSiR^2{}_2)_{e2}OSiR^1R^2{}_2$ (I)

wherein $R^1$ is a fluoroalkyl group represented by $(C_pF_{2p+1})$—R— where R and p are as described above, or an alkenyl group having a carbon number of 2 to 12, $R^2$ is identically or independently an alkyl group having a carbon number of 1 to 12, an aryl group having a carbon number of 6 to 20, an aralkyl group having a carbon number of 7 to 20, a hydroxyl group, or an alkoxy group having a carbon number of 1 to 6, and at least two of all $R^1$s are alkenyl groups having a carbon number of 2 to 12, 10 mol % or more of all $R^1$s and $R^2$s are the fluoroalkyl groups, e1 is a positive number, while e2 is 0 or a positive number, with each number satisfying 5<e1+e2<298.

3. The fluoroalkyl group-containing curable organopolysiloxane composition according to claim 1, wherein component (A) is an organopolysiloxane represented by the following average unit formula (II):

wherein $R^{Vi}$ is an alkenyl group having a carbon number of 2 to 12, $R^2$ is the same group as described above, $R^3$ is a fluoroalkyl group represented by $(C_pF_{2p+1})$—R— where R and p are as described above, and e is a number satisfying $20<e<298$.

4. The fluoroalkyl group-containing curable organopolysiloxane composition according to claim 1, wherein, in component (A), a fluoroalkyl group represented by $(C_pF_{2p+1})$—R— where R and p are as described above, is a trifluoropropyl group.

5. The fluoroalkyl group-containing curable organopolysiloxane composition according to claim 1, wherein component (B2) is an organohydrogen polysiloxane having a trifluoropropyl group in each molecule.

6. The fluoroalkyl group-containing curable organopolysiloxane composition according to claim 1, wherein component (A) is the following component (A1) or (A2):

(A1) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_p F_{2p+1})$—R— where R is an alkylene group having a carbon atom number of 1 to 10, while p is an integer of 1 or more and 8 or less, the average degree of polymerization is 50 to 300, and the volume content ratio of the organopolysiloxane having a degree of polymerization of 200 or more is 10% or more; and (A2) a fluoroalkyl group-containing organopolysiloxane comprising the following components (a1) and (a2) having different molecular weight distributions, wherein the average degree of polymerization of the overall mixture is 50 to 300:

(a1) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— where R is an alkylene group having a carbon atom number of 1 to 10, while p is an integer of 1 or more and 8 or less, and wherein the average degree of polymerization is 200 or more; and (a2) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— where R is an alkylene group having a carbon atom number of 1 to 10, while p is an integer of 1 or more and 8 or less, and wherein the average degree of polymerization is 50 or less.

7. A cured product obtained by curing the fluoroalkyl group-containing curable organopolysiloxane composition according to claim 1.

8. A film shaped or sheet shaped transducer member obtained by curing the fluoroalkyl group-containing curable organopolysiloxane composition according to claim 1.

9. A film shaped or sheet shaped electronic material or display apparatus member obtained by curing the fluoroalkyl group-containing curable organopolysiloxane composition according to claim 1.

10. A gel or elastomer transducer member obtained by curing the fluoroalkyl group-containing curable organopolysiloxane composition according to claim 1.

11. A transducer having a dielectric layer obtained by curing the fluoroalkyl group-containing curable organopolysiloxane composition according to claim 1.

12. A transducer, wherein an intermediate layer is interposed between at least a pair of electrode layers, with the transducer obtained by curing the fluoroalkyl group-containing curable organopolysiloxane composition according to claim 1 or allowing the curing reaction of the composition to partially proceed.

13. The transducer according to claim 12, wherein the intermediate layer is a gel or elastomer.

14. The transducer according to claim 12, wherein the intermediate layer is obtained by laminating one layer or two or more layers of a cured product obtained by curing the fluoroalkyl group-containing curable organopolysiloxane composition.

15. An electronic component or display apparatus having a cured product layer obtained by curing the fluoroalkyl group-containing curable organopolysiloxane composition according to claim 1 or allowing the curing reaction of the composition to partially proceed.

16. The fluoroalkyl group-containing curable organopolysiloxane composition according to claim 1, wherein component (B2) has formula (IV).

17. The fluoroalkyl group-containing curable organopolysiloxane composition according to claim 1, wherein component (A) is the following component (A2):

(A2) a fluoroalkyl group-containing organopolysiloxane comprising the following components (a1) and (a2) having different molecular weight distributions, wherein the average degree of polymerization of the overall mixture is 50 to 300:

(a1) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— where R is an alkylene group having a carbon atom number of 1 to 10, while p is an integer of 1 or more and 8 or less, and wherein the average degree of polymerization is 200 or more; and (a2) a fluoroalkyl group-containing organopolysiloxane which has at least two alkenyl groups having a carbon number of 2 to 12 per molecule, wherein 10 mol % or more of all substituent groups on silicon atoms are fluoroalkyl groups represented by $(C_pF_{2p+1})$—R— where R is an alkylene group having a carbon atom number of 1 to 10, while p is an integer of 1 or more and 8 or less, and wherein the average degree of polymerization is 50 or less.

* * * * *